(12) United States Patent
Wang et al.

(10) Patent No.: US 11,574,960 B2
(45) Date of Patent: Feb. 7, 2023

(54) PIXEL ARRANGEMENT STRUCTURE, DISPLAY SUBSTRATE, DISPLAY DEVICE AND MASK PLATE GROUP

(71) Applicant: BOE TECHNOLOGY GROUP CO., LTD., Beijing (CN)

(72) Inventors: Hongli Wang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/170,457

(22) Filed: Feb. 8, 2021

(65) Prior Publication Data

US 2021/0183965 A1     Jun. 17, 2021

Related U.S. Application Data

(63) Continuation-in-part of application No. 16/492,930, filed as application No. PCT/CN2018/124890 on Dec. 28, 2018, now Pat. No. 10,943,955.

(30) Foreign Application Priority Data

Feb. 9, 2018   (CN) .......................... 201810137012.7

(51) Int. Cl.
*H01L 27/32* (2006.01)
*H01L 51/52* (2006.01)
*H01L 51/00* (2006.01)

(52) U.S. Cl.
CPC ...... *H01L 27/3218* (2013.01); *H01L 27/3216* (2013.01); *H01L 27/3246* (2013.01); *H01L 51/0011* (2013.01); *H01L 51/5284* (2013.01)

(58) Field of Classification Search
None
See application file for complete search history.

(56) References Cited

U.S. PATENT DOCUMENTS 4,491,863 A     1/1985  Kurahashi
4,652,912 A     3/1987  Masubuchi
(Continued)

FOREIGN PATENT DOCUMENTS

CN     101192382 A     6/2008
CN     101339729 B     6/2010
(Continued)

OTHER PUBLICATIONS

Park, J., et al., "Luminance Uniformity of Large-Area OLEDs With an Auxiliary Metal Electrode," Journal of Display Technology, vol. 5, No. 8, Aug. 2009, pp. 306-311.
(Continued)

*Primary Examiner* — Parul H Gupta
(74) *Attorney, Agent, or Firm* — Dave Law Group LLC; Raj S. Dave

(57) ABSTRACT

An array substrate and an electronic device are disclosed. The array substrate includes a plurality of repeating regions, each repeating region includes a plurality of block groups, in each repeating region, the second base edge of the second color sub-pixel block and the third base edge of the third color sub-pixel block in the second block group are located on a first virtual line, the second base edge of the second color sub-pixel block and the third base edge of the third color sub-pixel block in the first second block group are located on a second virtual line, the first color sub-pixel block in the first block group and the first color sub-pixel block in the second block group are located between the first virtual line and the second virtual line.

16 Claims, 11 Drawing Sheets

(56) References Cited

U.S. PATENT DOCUMENTS

| | | | |
|---|---|---|---|
| 5,113,274 A | 5/1992 | Takahashi et al. |
| 5,341,153 A | 8/1994 | Benzschawel et al. |
| 6,768,482 B2 | 7/2004 | Asano et al. |
| 6,950,115 B2 | 9/2005 | Elliot |
| 7,123,277 B2 | 10/2006 | Brown Elliott et al. |
| 7,187,425 B2 | 3/2007 | Yamazaki |
| 7,525,526 B2 | 4/2009 | Brown Elliott et al. |
| 7,663,299 B2 | 2/2010 | Chao et al. |
| 7,733,359 B1 | 6/2010 | Hagge et al. |
| 8,115,216 B2 | 2/2012 | Smith et al. |
| 8,159,508 B2 | 4/2012 | Lee |
| 8,207,924 B2 | 6/2012 | Horiuchi et al. |
| 8,363,072 B2 | 1/2013 | Hong et al. |
| 8,446,435 B2 | 5/2013 | Tomizawa et al. |
| 8,754,913 B2 | 6/2014 | Hwang et al. |
| 8,994,015 B2 | 3/2015 | Pyon et al. |
| 9,064,450 B2 | 6/2015 | Kashiwabara |
| 9,337,241 B2 | 5/2016 | Lee et al. |
| 9,343,511 B1 | 5/2016 | Feng |
| 9,424,771 B2 | 8/2016 | Gong |
| 9,570,706 B2 | 2/2017 | Yim et al. |
| 9,647,039 B1 | 5/2017 | Wang et al. |
| 9,704,926 B2 | 7/2017 | Kim |
| 9,734,753 B2 | 8/2017 | Li et al. |
| 9,818,803 B2 | 11/2017 | Lee |
| 9,858,847 B2 | 1/2018 | Matsueda et al. |
| 9,871,085 B2 | 1/2018 | Cho et al. |
| 9,905,604 B2 | 2/2018 | Murata |
| 9,946,123 B2 | 4/2018 | Huangfu et al. |
| 9,984,624 B2 | 5/2018 | Takahashi et al. |
| 10,181,499 B2 | 1/2019 | Jo et al. |
| 10,210,787 B2 | 2/2019 | Jin |
| 10,274,654 B2 | 4/2019 | Jin et al. |
| 10,283,086 B1 | 5/2019 | Su et al. |
| 10,373,541 B2 | 8/2019 | Lee et al. |
| 10,504,483 B2 | 12/2019 | Chen et al. |
| 10,565,918 B2 | 2/2020 | Wu et al. |
| 10,840,307 B2 | 11/2020 | Gu et al. |
| 10,854,684 B2 | 12/2020 | Huangfu et al. |
| 10,861,905 B2 | 12/2020 | Wang |
| 10,867,545 B2 | 12/2020 | Kirisken |
| 10,909,901 B2 | 2/2021 | Wu et al. |
| 10,943,955 B2 | 3/2021 | Wang et al. |
| 11,069,286 B2 | 7/2021 | Tan et al. |
| 11,232,750 B2 | 1/2022 | Wang et al. |
| 11,233,096 B2 | 1/2022 | Huangfu et al. |
| 11,238,816 B2 | 2/2022 | Huangfu et al. |
| 11,264,430 B2 | 3/2022 | Huangfu et al. |
| 2005/0018110 A1 | 1/2005 | Liu |
| 2007/0205423 A1 | 9/2007 | Yamazaki et al. |
| 2007/0290973 A1 | 12/2007 | Wei |
| 2008/0001525 A1 | 1/2008 | Chao et al. |
| 2009/0079351 A1 | 3/2009 | Choi et al. |
| 2009/0121983 A1 | 5/2009 | Sung et al. |
| 2009/0302331 A1* | 12/2009 | Smith .................. H01L 27/3216 257/E33.062 |
| 2011/0025723 A1 | 2/2011 | Kim |
| 2011/0128262 A1 | 6/2011 | Chaji et al. |
| 2011/0234550 A1* | 9/2011 | Hong .................. H01L 27/326 345/204 |
| 2011/0260951 A1* | 10/2011 | Hwang .................. G09G 3/20 345/55 |
| 2011/0291549 A1 | 12/2011 | Kim et al. |
| 2012/0025182 A1 | 2/2012 | Umeda et al. |
| 2012/0039034 A1 | 2/2012 | Jepsen et al. |
| 2012/0092238 A1 | 4/2012 | Hwang et al. |
| 2012/0313844 A1 | 12/2012 | Im et al. |
| 2013/0234917 A1 | 9/2013 | Lee |
| 2014/0003045 A1 | 1/2014 | Lee et al. |
| 2014/0029262 A1 | 1/2014 | Maxik et al. |
| 2014/0145586 A1 | 5/2014 | Choi |
| 2014/0198479 A1 | 7/2014 | Chao et al. |
| 2014/0220715 A1 | 8/2014 | Kang |
| 2014/0226323 A1 | 8/2014 | Huang et al. |
| 2014/0252321 A1 | 9/2014 | Pyon et al. |
| 2014/0284570 A1 | 9/2014 | Jinta et al. |
| 2014/0346537 A1 | 11/2014 | Xi |
| 2015/0008820 A1 | 1/2015 | Lee |
| 2015/0015465 A1 | 1/2015 | Gong |
| 2015/0021637 A1 | 1/2015 | Ahn et al. |
| 2015/0102320 A1 | 4/2015 | Jung |
| 2015/0162391 A1 | 6/2015 | Kim |
| 2015/0162394 A1 | 6/2015 | Tokuda et al. |
| 2015/0200237 A1 | 7/2015 | Yim et al. |
| 2015/0270317 A1 | 9/2015 | Lee et al. |
| 2015/0311264 A1 | 10/2015 | Shen et al. |
| 2015/0311265 A1 | 10/2015 | Matsueda et al. |
| 2016/0013251 A1 | 1/2016 | Yoshida et al. |
| 2016/0019825 A1 | 1/2016 | Guo et al. |
| 2016/0049438 A1 | 2/2016 | Murata |
| 2016/0078807 A1 | 3/2016 | Sun et al. |
| 2016/0126295 A1 | 5/2016 | Sato |
| 2016/0126296 A1* | 5/2016 | Feng .................. H01L 27/3218 257/40 |
| 2016/0126298 A1 | 5/2016 | Chen |
| 2016/0155781 A1 | 6/2016 | Chaji |
| 2016/0171918 A1 | 6/2016 | Kim et al. |
| 2016/0190523 A1 | 6/2016 | Kim et al. |
| 2016/0196776 A1 | 7/2016 | Yang et al. |
| 2016/0240593 A1 | 8/2016 | Gu et al. |
| 2016/0253943 A1 | 9/2016 | Wang |
| 2016/0254476 A1 | 9/2016 | Park |
| 2016/0293678 A1 | 10/2016 | Wang |
| 2016/0343284 A1 | 11/2016 | Sun |
| 2016/0351119 A1 | 12/2016 | Ono |
| 2016/0357076 A1 | 12/2016 | Huangfu et al. |
| 2016/0358536 A1 | 12/2016 | Li et al. |
| 2016/0358985 A1 | 12/2016 | Bai et al. |
| 2016/0370919 A1 | 12/2016 | Xu et al. |
| 2017/0039924 A1 | 2/2017 | Jin |
| 2017/0133440 A1 | 5/2017 | Wang et al. |
| 2017/0179389 A1 | 6/2017 | Steckel et al. |
| 2017/0193880 A1 | 7/2017 | Lee et al. |
| 2017/0294491 A1 | 10/2017 | Jo et al. |
| 2017/0317150 A1 | 11/2017 | Chung et al. |
| 2017/0352710 A1 | 12/2017 | Hong et al. |
| 2018/0012547 A1 | 1/2018 | Li et al. |
| 2018/0088260 A1 | 3/2018 | Jin et al. |
| 2018/0090549 A1 | 3/2018 | Hamada et al. |
| 2018/0097043 A1 | 4/2018 | Song |
| 2018/0247984 A1 | 8/2018 | Wang et al. |
| 2018/0308412 A1 | 10/2018 | Wu et al. |
| 2018/0308907 A1 | 10/2018 | Jin et al. |
| 2018/0355466 A1 | 12/2018 | Mu |
| 2019/0035859 A1 | 1/2019 | Kang et al. |
| 2019/0088726 A1 | 3/2019 | Zhang |
| 2019/0096962 A1 | 3/2019 | Han et al. |
| 2019/0115399 A1 | 4/2019 | Jo et al. |
| 2019/0139513 A1 | 5/2019 | Su et al. |
| 2019/0140030 A1 | 5/2019 | Huangfu et al. |
| 2019/0206341 A1 | 7/2019 | Liao et al. |
| 2019/0237518 A1 | 8/2019 | Sun et al. |
| 2019/0326365 A1 | 10/2019 | Ema et al. |
| 2019/0340970 A1 | 11/2019 | Kirisken |
| 2020/0013833 A1 | 1/2020 | Wang et al. |
| 2020/0035172 A1 | 1/2020 | Chen |
| 2020/0043990 A1 | 2/2020 | Huangfu et al. |
| 2020/0119107 A1 | 4/2020 | Liu et al. |
| 2020/0258441 A1 | 8/2020 | Zhang et al. |
| 2020/0328259 A1 | 10/2020 | Joe |
| 2021/0091145 A1 | 3/2021 | Huangfu et al. |
| 2021/0335297 A1 | 10/2021 | Huangfu et al. |

FOREIGN PATENT DOCUMENTS

| | | |
|---|---|---|
| CN | 102201430 A | 9/2011 |
| CN | 101582241 B | 10/2011 |
| CN | 103681754 A | 3/2014 |
| CN | 104051493 A | 9/2014 |
| CN | 104269411 A | 1/2015 |
| CN | 104282727 A | 1/2015 |
| CN | 104332486 A | 2/2015 |
| CN | 104362170 A | 2/2015 |
| CN | 104597655 A | 5/2015 |

(56) References Cited

FOREIGN PATENT DOCUMENTS

| | | |
|---|---|---|
| CN | 104637987 A | 5/2015 |
| CN | 104701341 A | 6/2015 |
| CN | 104882464 A | 9/2015 |
| CN | 205231065 U | 5/2016 |
| CN | 205355055 U | 6/2016 |
| CN | 205608350 U | 9/2016 |
| CN | 205845956 U | 12/2016 |
| CN | 106293244 A | 1/2017 |
| CN | 106601167 A | 4/2017 |
| CN | 106782307 A | 5/2017 |
| CN | 206163494 U | 5/2017 |
| CN | 106935618 A | 7/2017 |
| CN | 106935630 A | 7/2017 |
| CN | 107248378 A | 10/2017 |
| CN | 107256695 A | 10/2017 |
| CN | 107275359 A | 10/2017 |
| CN | 107393468 A | 11/2017 |
| CN | 107481671 A | 12/2017 |
| CN | 107644888 A | 1/2018 |
| CN | 107665684 A | 2/2018 |
| CN | 107817632 A | 3/2018 |
| CN | 107910348 A | 4/2018 |
| CN | 105280139 B | 5/2018 |
| CN | 207781607 U | 8/2018 |
| CN | 207781608 U | 8/2018 |
| CN | 207883217 U | 9/2018 |
| CN | 109491158 A | 3/2019 |
| CN | 109559679 A | 4/2019 |
| CN | 109891487 A | 6/2019 |
| CN | 110010021 A | 7/2019 |
| EP | 2423911 A2 | 2/2012 |
| EP | 2680310 A1 | 1/2014 |
| JP | 2002-221917 A | 8/2002 |
| JP | 2005062416 A | 3/2005 |
| JP | 2008-015521 A | 1/2008 |
| JP | 2008225179 A | 9/2008 |
| JP | 2009533810 A | 9/2009 |
| JP | 2014225329 A | 12/2014 |
| JP | 2016090991 A | 5/2016 |
| JP | 2016130780 A | 7/2016 |
| JP | 2016537688 A | 12/2016 |
| KR | 10-2009-0049515 A | 5/2009 |
| KR | 1020110108050 A | 10/2011 |
| KR | 101347995 B1 | 1/2014 |
| KR | 1020150006668 A | 1/2015 |
| KR | 20160051511 A | 5/2016 |
| KR | 1020170116556 A | 10/2017 |
| WO | 2007088656 | 8/2007 |
| WO | 2014136149 A1 | 9/2014 |
| WO | 2016192241 A1 | 12/2016 |
| WO | 2017/140038 A1 | 8/2017 |
| WO | 2018014562 A1 | 1/2018 |
| WO | 2019084932 A1 | 5/2019 |
| WO | 2019134514 A1 | 7/2019 |
| WO | 2019134522 A2 | 7/2019 |
| WO | 2019153949 A1 | 8/2019 |
| WO | 2020/124693 A1 | 6/2020 |

OTHER PUBLICATIONS

Notice of Allowance dated Apr. 14, 2021, for U.S. Appl. No. 16/600,316, 21 pages.
Notice of Allowance dated Mar. 26, 2021, for U.S. Appl. No. 16/630,496, 10 pages.
European Search Report dated May 11, 2021, for European Application No. 21152119, 11 pages.
Office Action dated May 25, 2021 for Indian Application No. 202017026082, 5 pages.
Office action issued in Indian Application No. 201717038562, dated Oct. 15, 2019, 7 pages.
Office action issued in Korean Application No. 10-2017-7022698, dated May 29, 2019, 13 pages.
Candice Hellen Brown Elliot, "Reducing pixel count without reducing image quality", Information display Dec. 1999, 4 pages.
Lu Fang, Oscar C. Au and Ngai-Man Cheung, "Subpixel Rendering: From Font Rendering to Image Subsampling", IEEE Signal Processing Magazine, 1053-5888, April 5, 2013, 7 pages.
Dean S. Messing and Scott Daly, "Improved Display Resolution of Subsampled Colour Images Using Subpixel Addressing", IEEE ICIP 2002, 0-7803-7622-6, 2002, 4 pages.
Huang Cheng-qiang et al., "RGB to RGBG conversion algorithm based on weighting factors and related FPGA realization", China Journal of Liquid Crystals and Displays, vol. 32 No. 7, Jul. 2017, 8 pages.
Non-Final Office action issued in U.S. Appl. No. 15/536,347, dated Aug. 28, 2018, 18 pages.
Non-Final Office action issued in U.S. Appl. No. 15/578,481, dated Feb. 1, 2019, 24 pages.
Final Office action issued in U.S. Appl. No. 15/578,481, dated Jul. 11, 2019, 17 pages.
Search report issued in European Application No. 17768339.8, dated Jun. 12, 2019, 8 pages.
Notice of Reasons for Refusal dated Oct. 19, 2020 for Japanese Patent Application No. 2017-544608.
Notice of Reasons for Refusal dated Dec. 25, 2020 for Korean Patent Application No. 10-2019-7027773.
International Search Report and Written Opinion dated Nov. 16, 2016, for PCT Application No. PCT/CN2016/081097, 5 pages.
International Search Report and Written Opinion dated Jun. 8, 2017, for PCT Application No. PCT/CN2017/075957, 8 pages.
International Search Report and Written Opinion dated Mar. 14, 2019, for PCT Application No. PCT/CN2018/124404, 7 pages.
International Search Report and Written Opinion dated Mar. 21, 2019, for PCT Application No. PCT/CN2018/124445, 6 pages.
International Search Report and Written Opinion dated Mar. 26, 2019, for PCT Application No. PCT/CN2018/124881, 6 pages.
International Search Report and Written Opinion dated Mar. 27, 2019, for PCT Application No. PCT/CN2018/124884, 9 pages.
International Search Report and Written Opinion dated Mar. 27, 2019, for PCT Application No. PCT/CN2018/124890, 6 pages.
International Search Report and Written Opinion dated Oct. 28, 2019, for PCT Application No. PCT/CN2018/097765, 9 pages.
International Search Report and Written Opinion dated Mar. 29, 2019, for PCT Application No. PCT/CN2018/124386, 6 pages.
International Search Report dated May 9, 2020, for PCT Application No. PCT/CN2019/098707, 1 page.
International Search Report dated May 28, 2020, for PCT Application No. PCT/CN2019/098705, 1 page.
Office action issued in Korean Application No. 1020197024785, dated Jul. 30, 2020, 17 pages.
Office action issued in Chinese Application No. 201810135947.1, dated Mar. 3, 2020, 17 pages.
Notice of Allowance issued for U.S. Appl. No. 16/234,777, dated Sep. 1, 2020, 22 pages.
Non-Final office action issued for U.S. Appl. No. 16/600,316, dated Oct. 6, 2020, 45 pages.
Non-Final office action issued for U.S. Appl. No. 16/621,918, dated Sep. 29, 2020, 34 pages.
Nan-Final Office Action for U.S. Appl. No. 16/621,904, dated Aug. 2, 2021, 47 pages.
Non-Final Office Action for U.S. Appl. No. 16/483,210, dated Sep. 22, 2021, 69 pages.
Non-Final Office Action for U.S. Appl. No. 16/621,904, dated Sep. 22, 2021, 47 pages.
Notice of Allowance issued for U.S. Appl. No. 17/108,691 dated Sep. 13, 2021, 14 pages.
Office action issued for Indian application No. 202017027785 dated Aug. 19, 2021, 5 pages.
Office action issued for EP application No. 18905693.0 dated Oct. 1, 2021, 9 pages.
European search report issued for EP Application No. 18905189.9 dated Oct. 19, 2021, 8 Pages.
European search report issued for EP Application No. 18903035.6 dated Nov. 8, 2021, 10 Pages.
Office Action issued for IN Application No. 202027048001 dated Dec. 6, 2021, 6 Pages.

(56) References Cited

OTHER PUBLICATIONS

Non-Final Office action issued for U.S. Appl. No. 16/622,045 dated Dec. 21, 2021, 49 pages.
Notification of Refusal issued for Korean Application No. 10-2021-7030323, dated Jan. 25, 2022, 25 pages.
Non-final Office action issued for U.S. Appl. No. 16/621,904, dated Mar. 15, 2022, 24, pages.
Office action issued for Chinese Application No. 201680082630.5, dated Apr. 1, 2022, 17 pages.
Notice of Allowance for U.S. Appl. No. 16/755,970, dated May 6, 2022, 65 pages.
Non-Final office action issued for U.S. Appl. No. 17/497,630, dated May 12, 2022, 74 pages.
Office action issued for Australian Application No. 2021203983, dated May 12, 2022, 4 pages.
Search Report issued for European Application No. 19933217.2, dated Jul. 5, 2022, 9 pages.
Office action issued for Japanese Patent Application No. 2019-543028, dated Nov. 21, 2022, 16 pages.
Office action issued for Japanese Patent Application No. 2019-549456, dated Nov. 24, 2022, 23 pages.
Office action issued for Japanese Patent Application No. 2020-536078, dated Nov. 18, 2022, 23 pages.
Search report issued for EP Application No. 19832268.7, dated Oct. 25, 2022, 15 pages.
Search report issued for EP Application No. 19933238.8, dated Oct. 18, 2022, 7 pages.

\* cited by examiner

PIXEL ARRANGEMENT STRUCTURE, DISPLAY SUBSTRATE, DISPLAY DEVICE AND MASK PLATE GROUP

CROSS REFERENCE TO RELATED APPLICATIONS

This application is a continuation in part of U.S. Ser. No. 16/492,930 filed on Sep. 10, 2019 which is a national stage application of international application PCT/CN2018/124890 filed on Dec. 28, 2018, which claims priority from CN201810137012.7 filed on Feb. 9, 2018. For all purposes, the disclosures of all of these applications hereby incorporated herein by reference in their entirety.

TECHNICAL FIELD

Embodiments of the present disclosure relate to a pixel arrangement structure, a display substrate, a display device and a mask plate set.

BACKGROUND

With continuous development of the display technology, people have higher and higher requirements for resolution of a display device. Due to advantages such as high display quality, high-resolution display devices are applied more and more widely. Usually, the resolution of the display device can be improved by reducing a pixel size and a pixel pitch. However, reduction in the pixel size and the pixel pitch is also increasingly demanding for precision of manufacturing process, which may result in increased difficulties and costs in a manufacturing process of the display device.

On the other hand, a conventional mode in which one pixel is simply defined by a red sub-pixel, a green sub-pixel and a blue sub-pixel may be changed by using a Sup-Pixel Rendering (SPR) technology, because resolution of human eyes with respect to different colors of sub-pixels is varied; and by sharing between different pixels a sub-pixel of a color which the resolution of a certain position is not sensitive to, an equivalent performance capability of pixel resolution may be simulated by a relatively small amount of sub-pixels, so as to simplify the manufacturing process and reduce the fabrication costs.

SUMMARY

At least one embodiment of the present disclosure provides an array substrate, which includes a plurality of first color sub-pixel blocks, a plurality of second color sub-pixel blocks and a plurality of third color sub-pixel blocks distributed in a plurality of repeating regions, each of the plurality of repeating regions includes a plurality of block groups, each of the plurality of block groups includes one first color sub-pixel block of the plurality of first color sub-pixel blocks, one second color sub-pixel block of the plurality of second color sub-pixel blocks, and one third color sub-pixel block of the plurality of third color sub-pixel blocks, the plurality of block groups includes a first block group and a second block group, a shape of the first color sub-pixel block includes a first protrusion and a first base edge opposite to the first protrusion, a shape of the second color sub-pixel block includes a second protrusion and a second base edge opposite to the second protrusion, a shape of the third color sub-pixel block includes a third protrusion and a third base edge opposite to the third protrusion, in each of the plurality of repeating regions, the second base edge of the second color sub-pixel block and the third base edge of the third color sub-pixel block in the second block group are located on a first virtual line, the second base edge of the second color sub-pixel block and the third base edge of the third color sub-pixel block in the first second block group are located on a second virtual line, the first color sub-pixel block in the first block group and the first color sub-pixel block in the second block group are located between the first virtual line and the second virtual line, the first protrusion of the first color sub-pixel block in the first block group is protruded toward the second virtual line, the first protrusion of the first color sub-pixel block in the second block group is protruded toward the first virtual line.

For example, in the array substrate provided by an embodiment of the present disclosure, the plurality of block groups includes a third block group and a fourth block group, in each of the plurality of repeating regions, the second base edge of the second color sub-pixel block and the third base edge of the third color sub-pixel block in the third block group are located on the second virtual line, the second base edge of the second color sub-pixel block and the third base edge of the third color sub-pixel block in the fourth block group are located on a third virtual line, the third virtual line is located at a side of the second virtual line away from the first virtual line, the first color sub-pixel block in the third block group and the first color sub-pixel block in the fourth block group are located between the second virtual line and the third virtual line, the first protrusion of the first color sub-pixel block in the third block group is protruded toward the second virtual line, the first protrusion of the first color sub-pixel block in the fourth block group is protruded toward the third virtual line.

For example, in the array substrate provided by an embodiment of the present disclosure, the first color sub-pixel block of the second block group is not overlapped with the second virtual line, the first color sub-pixel block of the fourth block group is not overlapped with the second virtual line, the first color sub-pixel block of the second block group and the first color sub-pixel block of the fourth block group are located at two sides of the second virtual line.

For example, in the array substrate provided by an embodiment of the present disclosure, a distance between an orthographic projection of the first color sub-pixel block in the first block group on a fourth virtual line perpendicular to the first virtual line and an orthographic projection of the second color sub-pixel in the first block group on the fourth virtual line is smaller than a distance between the first color sub-pixel in the second block group and the first color sub-pixel in the fourth block group.

For example, in the array substrate provided by an embodiment of the present disclosure, a shortest distance between the first color sub-pixel block of the second block group and the first color sub-pixel block of the fourth block group and a shortest distance between the second color sub-pixel block and the third color sub-pixel block in the second block group are different.

For example, in the array substrate provided by an embodiment of the present disclosure, within the same one of the plurality of repeating region, the second color sub-pixel block of the first block group and the second color sub-pixel block of the third block group are integrated to form a second unitary sub-pixel block; within two adjacent ones of the plurality of repeating regions in a direction perpendicular to the first virtual line, the two adjacent ones of the plurality of repeating regions include a first repeating region and a second repeating region sequentially arranged in the direction perpendicular to the first virtual line; and the second color sub-pixel block of the fourth block group of the first repeating region and the second color sub-pixel block of the second block group of the second repeating region are integrated to form a second unitary sub-pixel block.

For example, in the array substrate provided by an embodiment of the present disclosure, within the same one of the plurality of repeating region, the third color sub-pixel block of the first block group and the third color sub-pixel block of the third block group are integrated to form a third unitary sub-pixel block; the third color sub-pixel block of the fourth block group of the first repeating region and the third color sub-pixel block of the second block group of the second repeating region are integrated to form a third unitary sub-pixel block.

For example, in the array substrate provided by an embodiment of the present disclosure, a distance between a vertex of the first protrusion of the first color sub-pixel block of the second block group and a vertex of the first protrusion of the first color sub-pixel block of the fourth block group is larger than a length of the second unitary sub-pixel block in a direction perpendicular to the first virtual line and a length of the third unitary sub-pixel block in a direction perpendicular to the first virtual line.

For example, in the array substrate provided by an embodiment of the present disclosure, the distance between a vertex of the first protrusion of the first color sub-pixel block of the second block group and a vertex of the first protrusion of the first color sub-pixel block of the fourth block group is smaller or equal to a distance between the first virtual line and the second virtual line.

For example, in the array substrate provided by an embodiment of the present disclosure, the shape of the first color sub-pixel block includes an oblique edge, being not parallel to the first virtual line or a direction perpendicular to the first virtual line, the shape of the second color sub-pixel block includes an oblique edge, being not parallel to the first virtual line or a direction perpendicular to the first virtual line, the shape of the third color sub-pixel block includes an oblique edge, being not parallel to the first virtual line or a direction perpendicular to the first virtual line, the oblique edge of a first one of the first color sub-pixel block, the second color sub-pixel block, and the third color sub-pixel block is substantially parallel to the oblique edge of a second one of the first color sub-pixel block, the second color sub-pixel block, and the third color sub-pixel block, which is adjacent to the first one of the first color sub-pixel block, the second color sub-pixel block, and the third color sub-pixel block.

For example, in the array substrate provided by an embodiment of the present disclosure, a shape of at least one of the second unitary sub-pixel block and the third unitary sub-pixel block includes a parallel edge group, the parallel edge group includes two parallel edges, which are both approximately parallel to a direction perpendicular to the first virtual line, and the two parallel edges have different lengths.

For example, in the array substrate provided by an embodiment of the present disclosure, a shape of at least one of the second unitary sub-pixel block and the third unitary sub-pixel block includes a hexagon, the hexagon includes a parallel edge group including two parallel edges, a first opposite edge group including two opposite edges, and a second opposite edge group including two opposite edges, the two opposite edges in the first opposite edge group are disposed opposite to each other, the two opposite edges in the second opposite edge group are disposed opposite to each other, and the two parallel edges in the parallel edge group have different lengths.

For example, in the array substrate provided by an embodiment of the present disclosure, the two parallel edges in the parallel edge group of at least one of the second unitary sub-pixel block and the third unitary sub-pixel block in the first block group and the third block group are approximately parallel to a direction perpendicular to the first virtual line, one of the two parallel edges in the parallel edge group which is close to a center line, passing through a center of the first color sub-pixel block in the first block group and extending along the direction perpendicular to the first virtual line, is a first parallel edge, and one of the two parallel edges in the parallel edge group which is away from the center line, passing through a center of the first color sub-pixel block in the first block group and extending along the direction perpendicular to the first virtual line, is a second parallel edge, a length of the first parallel edge is smaller than or equal to a length of the second parallel edge.

For example, in the array substrate provided by an embodiment of the present disclosure, a shape of the second unitary sub-pixel block and a shape of the third unitary sub-pixel block both include the hexagon, a distance between the first parallel edge of the hexagon of the second unitary sub-pixel block in the first block group and the third block group and the center line of the first color sub-pixel block in the first block group is smaller than a distance between the first parallel edge of the hexagon of the third unitary sub-pixel block in the first block group and the third block group and the center line of the first color sub-pixel block in the first block group, and a length of the first parallel edge of the hexagon of the second unitary sub-pixel block in the first block group and the third block group is smaller than a length of the first parallel edge of the hexagon of the third unitary sub-pixel block in the first block group and the second block group, or, a distance between the first parallel edge of the hexagon of the second unitary sub-pixel block in the first block group and the third block group and the center line of the first color sub-pixel block in the first block group is larger than a distance between the first parallel edge of the hexagon of the third unitary sub-pixel block in the first block group and the third block group and the center line of the first color sub-pixel block in the first block group, and a length of the first parallel edge of the hexagon of the second unitary sub-pixel block in the first block group and the third block group is larger than a length of the first parallel edge of the hexagon of the third unitary sub-pixel block in the first block group and the second block group.

For example, in the array substrate provided by an embodiment of the present disclosure, a center line of the first sub-pixel block in the first block group extending in a direction perpendicular to the first virtual line passes through at least one of the second unitary sub-pixel block and the third unitary sub-pixel block.

For example, in the array substrate provided by an embodiment of the present disclosure, two adjacent ones of the plurality of second color sub-pixel blocks are integrated into a second unitary sub-pixel block, and two adjacent ones of the plurality of third color sub-pixel blocks are integrated into a third unitary sub-pixel block, the shape of at least one of the second unitary sub-pixel block and the third unitary sub-pixel block includes a polygon, the polygon includes two vertexes which have the largest distance in the second direction, and a line connecting the two vertexes is approximately parallel to a direction perpendicular to the first virtual line, in the polygon of at least one of the second unitary sub-pixel block and the third unitary sub-pixel block, an area of a first portion located at a first side of the line connecting the two vertexes is different from an area of a second portion located at a second side of the line connection the two vertexes.

For example, in the array substrate provided by an embodiment of the present disclosure, a width of the first portion in a direction perpendicular to the first virtual line is different from a width of the second portion in the direction perpendicular to the first virtual line.

For example, in the array substrate provided by an embodiment of the present disclosure, the array substrate further including: a first color pixel electrode, a first pixel defining layer, provided on the first color pixel electrode and including a first opening exposing a portion of the first color pixel electrode, a first color light-emitting layer, provided on the first pixel defining layer and contacting the portion of the first color pixel electrode as exposed by the first opening; a second color pixel electrode, a second pixel defining layer, provided on the second color pixel electrode and including a second opening exposing a portion of the second color pixel electrode, a second color light-emitting layer, provided on the second pixel defining layer and contacting the portion of the second color pixel electrode as exposed by the second opening; a third color pixel electrode, a third pixel defining layer, provided on the third color pixel electrode and including a third opening exposing a portion of the third color pixel electrode, a third color light-emitting layer, provided on the third pixel defining layer and contacting the portion of the third color pixel electrode as exposed by the third opening, two adjacent ones of the plurality of second color sub-pixel blocks are integrated into a second unitary sub-pixel block, and two adjacent ones of the plurality of third color sub-pixel blocks are integrated into a third unitary sub-pixel block, a shape and a size of the second unitary sub-pixel block is defined by the second opening, and a shape and a size of the third unitary sub-pixel block is defined by the third opening; two second color pixel electrodes of the two adjacent ones of the plurality of second color sub-pixel blocks integrated into the second unitary sub-pixel block are integrated as one second unitary pixel electrode, two third color pixel electrodes of the two adjacent ones of the plurality of third color sub-pixel blocks integrated into the third unitary sub-pixel block are as one third unitary pixel electrode.

For example, in the array substrate provided by an embodiment of the present disclosure, the plurality of block groups includes a third block group and a fourth block group, in each of the plurality of repeating regions, the second base edge of the second color sub-pixel block and the third base edge of the third color sub-pixel block in the third block group are located on the second virtual line, the second base edge of the second color sub-pixel block and the third base edge of the third color sub-pixel block in the fourth block group are located on a third virtual line, the third virtual line is located at a side of the second virtual line away from the first virtual line, the first color sub-pixel block in the third block group and the first color sub-pixel block in the fourth block group are located between the second virtual line and the third virtual line, the first protrusion of the first color sub-pixel block in the third block group is protruded toward the second virtual line, the first protrusion of the first color sub-pixel block in the fourth block group is protruded toward the third virtual line, the first color light-emitting layer in the second block group and the first color light-emitting layer in the fourth block group are integrated as one first color light-emitting layer, and the first color pixel electrode of the first color sub-pixel block in the third block group and the first color pixel electrode of the first color-pixel block in the fourth block group are two independent first color pixel electrodes.

At least one embodiment of the present disclosure further provides an electronic device, including any one of the abovementioned array substrate.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the invention apparent, technical solutions according to the embodiments of the present disclosure will be described clearly and completely as below in conjunction with the accompanying drawings of embodiments of the present disclosure. It is to be understood that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly.

In the study, the inventor(s) of the present application notices that: in order to manufacture a high-resolution display device, it is necessary to reduce a pixel size and a pixel pitch; however, reduction in the pixel size and the pixel pitch is also increasingly demanding for precision of manufacturing process, which may result in increased difficulties and costs in a manufacturing process of the display device. For example, upon a high-resolution active matrix organic light emitting diode (AMOLED) display device being manufactured, due to a limitation in process precision of a fine metal mask (FMM) technology, it is difficult and expensive to manufacture the active matrix organic light emitting diode (AMOLED) display device having high resolution (for example, Pixels Per Inch (PPI) greater than 300).

Figure 1:
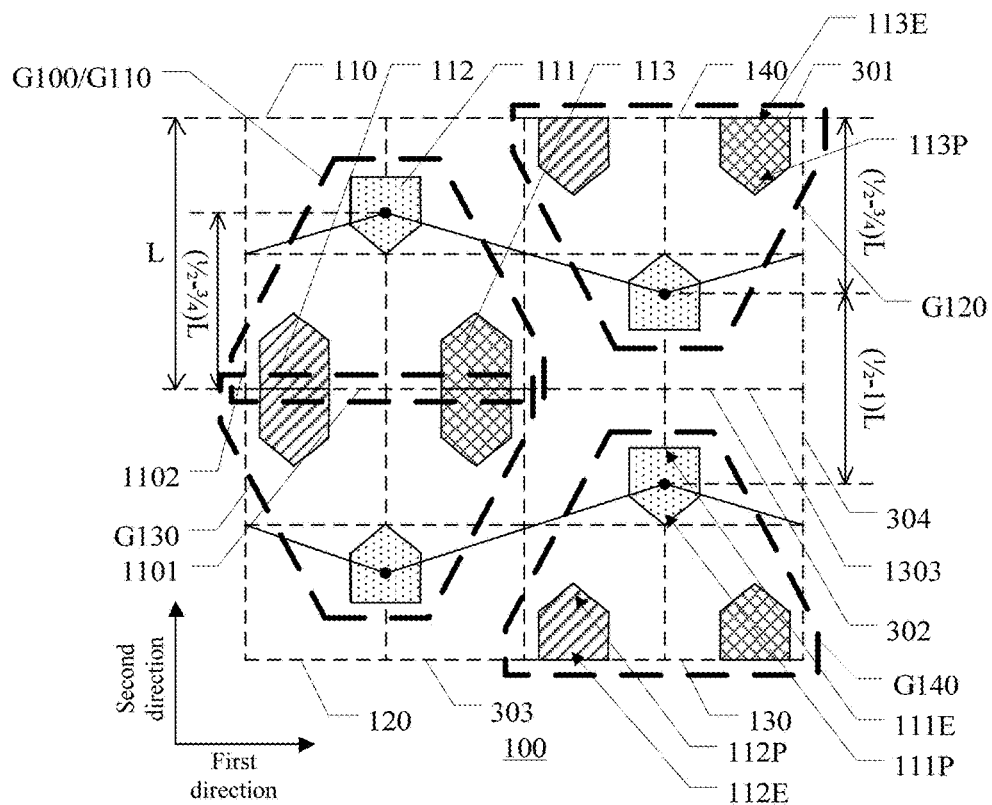
FIG. 1 is a schematic diagram of a pixel arrangement structure provided by an embodiment of the present disclosure.

At least one embodiment of the present disclosure provides a pixel arrangement structure. FIG. 1 is a schematic diagram of a pixel arrangement structure provided by an embodiment of the present disclosure. The pixel arrangement structure comprises a plurality of first color sub-pixel blocks 111, a plurality of second color sub-pixel blocks 112 and a plurality of third color sub-pixel blocks 113 distributed in a plurality of minimum repeating regions 100. FIG. 1 shows one minimum repeating region 100; as illustrated by FIG. 1, each of the plurality of minimum repeating regions 100 includes a first virtual rectangle 110; and the first virtual rectangle 110 includes one first color sub-pixel block 111, one second color sub-pixel block 112 and one third color sub-pixel block 113. The first virtual rectangle 110 includes a first edge 1101 extending in a first direction and a second edge 1102 extending in a second direction; the second color sub-pixel block 112 and the third color sub-pixel block 113 are distributed on two sides of a perpendicular bisector of the first edge 1101; a distance between the second color sub-pixel block 112 and the first edge 1101 and a distance between the third color sub-pixel block 113 and the first edge 1101 are both smaller than a distance between the first color sub-pixel block 111 and the first edge 1101; and a center of the first color sub-pixel block 111 is located on the perpendicular bisector of the first edge 1101 and a distance between the center of the first color sub-pixel block 111 and the first edge 1101 is approximately ½ to ¾ of a length of the second edge 1102. For example, as illustrated by FIG. 1, the length of the second edge 1102 is L, and the distance between the center of the first color sub-pixel block 111 and the first edge 1101 is (½ to ¾)L. It should be noted that, the above-described first virtual rectangle is intended to better describe a position of the first color sub-pixel block, and is not an actual structure. In addition, a range of a virtual rectangle of the above-described first virtual rectangle may be larger than a light-emitting region of the first color sub-pixel block, the second color sub-pixel block and the third color sub-pixel block in the first virtual rectangle. The above-described "center" refers to a geometric center of a shape of a sub-pixel block (for example, the first color sub-pixel block, the second color sub-pixel block or the third color sub-pixel block); and the above-described "a distance between the second color sub-pixel block and the first edge and a distance between the third color sub-pixel block and the first edge" refer to a distance between the center of the second color sub-pixel block and the first edge and a distance between the center of the third color sub-pixel block and the first edge.

In the pixel arrangement structure provided by this embodiment, because the second color sub-pixel block and the third color sub-pixel block are distributed on two sides of the perpendicular bisector of the first edge, and the center of the first color sub-pixel block is located on the perpendicular bisector of the first edge and the distance between the center of the first color sub-pixel block and the first edge is ½ to ¾ of the length of the second edge, a distance between centers of adjacent two first color sub-pixel blocks is larger than ½ of the length of the second edge, which, thus, can avoid a case where the adjacent two first color sub-pixel blocks are difficult to distinguish and are visually combined into one by human eyes due to a closer distance between the adjacent first color sub-pixel blocks, so that granular sensation generated thereby can be avoided. Thus, the pixel arrangement structure can improve uniformity of distribution of first color sub-pixel blocks, so as to improve visual resolution and further improve display quality.

It should be noted that, upon designing a pixel arrangement structure, the sub-pixel is generally designed in a regular shape, such as a hexagon, a pentagon, a trapezoid or other shapes. The center of the sub-pixel may be the geometric center of the above regular shape upon designing. However, in an actual manufacturing process, the shape of the formed sub-pixels generally deviates from the regular shape of the above design. For example, corners of the abovementioned regular shape may be rounded; therefore, the shape of the sub-pixel can be a figure with rounded angle. Furthermore, the shape of the actually fabricated sub-pixel can also have other variations from the shape of the design. For example, the shape of a sub-pixel designed as a hexagon may become approximately elliptical in actual fabrication. Therefore, the center of the sub-pixel may also not be the strict geometric center of the irregular shape of the formed sub-pixel. In embodiments of the present disclosure, the center of the sub-pixel may have a certain offset from the geometric center of the shape of the sub-pixel. The center of a sub-pixel refers to any point in a region surrounded by specific points on radiation segments each of which is from a geometric center of the sub-pixel to a point on the edge of the sub-pixel, each of the specific points is located on a corresponding radiation segment at location ⅓ of length of the radiant section from the geometric center. The definition of the center of the sub-pixel is applicable to the center of the sub-pixel having the regular shape, and is also applicable to the center of the sub-pixel having the irregular shape.

For example, in some examples, the above-described minimum repeating region can be translated and arranged repeatedly to form a complete pixel arrangement structure. It should be noted that any sub-unit that can be translated and arranged repeatedly is not included in the minimum repeating region.

At least one embodiment of the present disclosure provides an array substrate, as illustrated by FIG. 1, the pixel arrangement structure shown in FIG. 1 can also be regarded as an array substrate, the minimum repeating region 100 can be regarded as one repeating region 100 of the array substrate. Each of the plurality of repeating regions 100 includes a plurality of block groups G100, each of the plurality of block groups G100 includes one first color sub-pixel block 111, one second color sub-pixel block 112, and one third color sub-pixel block 113, the plurality of block groups G100 includes a first block group G110 and a second block group G120, a shape of the first color sub-pixel block 111 comprises a first protrusion 111P and a first base edge 111E opposite to the first protrusion 111P, a shape of the second color sub-pixel block 112 includes a second protrusion 112P and a second base edge 112E opposite to the second protrusion 112P, a shape of the third color sub-pixel block 113 includes a third protrusion 113P and a third base edge 113E opposite to the third protrusion 113P, in each of the plurality of repeating regions 100, the second base edge 112E of the second color sub-pixel block 112 and the third base edge 113E of the third color sub-pixel block 113 in the second block group G120 are located on a first virtual line 301, the second base edge 112E of the second color sub-pixel block 112 and the third base edge 113E of the third color sub-pixel block 113 in the first second block group G110 are located on a second virtual line 302, the first color sub-pixel block 111 in the first block group G110 and the first color sub-pixel block 111 in the second block group G120 are located between the first virtual line 301 and the second virtual line 302, the first protrusion 111P of the first color sub-pixel block 111 in the first block group G110 is protruded toward the second virtual line 302, the first protrusion 111P of the first color sub-pixel block 111 in the second block group G120 is protruded toward the first virtual line 301.

For example, as illustrated by FIG. 1, the plurality of block groups G100 includes a third block group G130 and a fourth block group G140, in each of the plurality of repeating regions 100, the second base edge 112E of the second color sub-pixel block 112 and the third base edge 113E of the third color sub-pixel block 113 in the third block group G130 are located on the second virtual line 302, the second base edge 112E of the second color sub-pixel block 112 and the third base edge 113E of the third color sub-pixel block 113 in the fourth block group G140 are located on a third virtual line 303, the third virtual line 303 is located at a side of the second virtual line 302 away from the first virtual line 301, the first color sub-pixel block 111 in the third block group G130 and the first color sub-pixel block 111 in the fourth block group G140 are located between the second virtual line 302 and the third virtual line 303, the first protrusion 111P of the first color sub-pixel block 111 in the third block group G130 is protruded toward the second virtual line 302, the first protrusion 111P of the first color sub-pixel block 111 in the fourth block group G140 is protruded toward the third virtual line 303.

For example, as illustrated by FIG. 1, the first block group G110 is located in the first virtual rectangle 110, the second block group G120 is located in the fourth virtual rectangle 140, the third block group G130 is located in the second virtual rectangle 120, and the fourth block group G140 is located in the third virtual rectangle 140.

For example, as illustrated by FIG. 1, the first color sub-pixel block 111 of the second block group G120 is not overlapped with the second virtual line 302, the first color sub-pixel block 111 of the fourth block group G140 is not overlapped with the second virtual line 302, the first color sub-pixel block 111 of the second block group G120 and the first color sub-pixel block 111 of the fourth block group G140 are located at two sides of the second virtual line 302.

For example, the first color sub-pixel block 111 of the second block group G120 and the first color sub-pixel block 111 of the fourth block group G140 are symmetrical with respect to the second virtual line 302.

For example, as illustrated by FIG. 1, a distance between an orthographic projection of the first color sub-pixel block 111 in the first block group G110 on a fourth virtual line 304 perpendicular to the first virtual line 301 and an orthographic projection of the second color sub-pixel 112 in the first block group G110 on the fourth virtual line 304 is smaller than a distance between the first color sub-pixel 111 in the second block group G120 and the first color sub-pixel 111 in the fourth block group G140.

For example, as illustrated by FIG. 1, a shortest distance between the first color sub-pixel block 111 of the second block group G120 and the first color sub-pixel block 111 of the fourth block group G140 and a shortest distance between the second color sub-pixel block 112 and the third color sub-pixel block 113 in the second block group G120 are different. It is to be noted that, the abovementioned "shortest distance" refers to a shortest distance between edges of two sub-pixel blocks.

For example, as illustrated by FIG. 1, in the first block group G110, a distance between an orthographic projection of the second color sub-pixel block 112 on the second virtual line 302 and an orthographic projection of the first color sub-pixel block 111 on the second virtual line 302 is substantially the same as a distance between an orthographic projection of the first color sub-pixel block 111 on the second virtual line 302 and an orthographic projection of the third color sub-pixel block 113 on the second virtual line 302.

For example, the distance between an orthographic projection of the second color sub-pixel block 112 on the second virtual line 302 and an orthographic projection of the first color sub-pixel block 111 on the second virtual line 302 is 0.8-1.2 times of the distance between an orthographic projection of the first color sub-pixel block 111 on the second virtual line 302 and an orthographic projection of the third color sub-pixel block 113 on the second virtual line 302.

For example, as illustrated by FIG. 1, the first virtual line 301, the second virtual line 302, and the third virtual line 303 extend in the first direction, and the direction perpendicular to the first virtual line 301 is the second direction.

For example, in some examples, the center of the first color sub-pixel block 111 is located on the perpendicular bisector of the first edge 1101 and has the distance between the center of the first color sub-pixel block 111 and the first edge 1101 is ½ to ¾ of the length of the second edge 1102.

It should be noted that, upon the pixel arrangement structure being designed, the sub-pixel block (for example, the first color sub-pixel block, the second color sub-pixel block or the third color sub-pixel block) is usually designed to have a regular shape of, for example, a hexagon, a pentagon, a trapezoid, and the like. In design, the center of the sub-pixel block may be a geometric center of the above-described regular shape. However, in an actual manufacturing process, the shape of the formed sub-pixel block usually has certain deviation from the regular shape as designed above. For example, respective corners of the above-described regular shape may become rounded, so the shape of the sub-pixel block (for example, the first color sub-pixel block, the second color sub-pixel block or the third color sub-pixel block) may be a rounded shape. In addition, the shape of the actually manufactured sub-pixel block may further have other variations from the designed shape. For example, the shape of the sub-pixel block designed as a hexagon may become an approximate ellipse in actual fabrication. Therefore, the center of the sub-pixel block may not be the strict geometric center of the irregular shape of the sub-pixel block manufactured. In the embodiment of the present disclosure, the center of the sub-pixel block may have a certain offset from the geometric center of the shape of the sub-pixel block. The center of the sub-pixel block refers to any point within a region enclosed by specific points on radiation line segments starting from the geometric center of the sub-pixel block to respective points of an edge of the sub-pixel block, and the specific point on the radiation line segment is located at a distance of ⅓ the length of the radiation line segment from the geometric center. A definition of the center of the sub-pixel block is applicable to the center of the shape of the regular-shaped sub-pixel block, and is also applicable to the center of the irregular-shaped sub-pixel block.

In addition, as described above, due to various fabrication errors, the shape of the actually manufactured sub-pixel block may deviate from the shape of the designed sub-pixel block. Therefore, in the present disclosure, a certain error is allowed in a position of the center of the sub-pixel block as well as a relationship between the center of the sub-pixel block and a position of any other object. For example, with respect to a line connecting centers of sub-pixel blocks or a line passing through the center of the sub-pixel block, if the line satisfies other corresponding definitions (for example, an extension direction), the line only has to pass through the region enclosed by the specific points of the radiation line segments as described above. For another example, if the center of the sub-pixel block is located on a certain line, it refers to that the line only has to pass through the region enclosed by the specific points of the radiation line segments as described above.

For example, in some examples, the first color sub-pixel block 111, the second color sub-pixel block 112 and the third color sub-pixel block 113 may separately serve as one sub-pixel for display; and the first color sub-pixel block 111, the second color sub-pixel block 112 and the third color sub-pixel block 113 in the first virtual rectangle 110 may constitute a pixel unit for color display. Of course, the embodiment of the present disclosure includes, but is not limited thereto, and the first color sub-pixel block 111, the second color sub-pixel block 112 and the third color sub-pixel block 113 may be respectively combined with an adjacent same color sub-pixel into one sub-pixel for display.

For example, in some examples, the first color sub-pixel block is a sensitive color sub-pixel. Because sensitivity of human eyes to colors is varied, upon adjacent sensitive color sub-pixels being closer to each other, it is likely that the adjacent two sensitive color sub-pixels are difficult to distinguish and are visually combined into one by the human eyes due to a closer distance between the adjacent sensitive color sub-pixels. Thus, the pixel arrangement structure can improve distribution uniformity of sensitive color sub-pixels, so as to improve visual resolution and further improve display quality. It should be noted that, upon a red, green and blue (RGB) mode being used in the pixel arrangement structure, the above-described sensitive color is green.

For example, in some examples, the first color sub-pixel block is a green sub-pixel, the second color sub-pixel block is a red sub-pixel, and the third color sub-pixel block is a blue sub-pixel; or, the first color sub-pixel block is a green sub-pixel, the second color sub-pixel block is a blue sub-pixel, and the third color sub-pixel block is a red sub-pixel. Of course, the embodiment of the present disclosure includes, but is not limited thereto.

For example, in some examples, a distance between an edge of the first color sub-pixel block 111 that is close to the first edge 1101 and the first edge 1101 is ⅓ to 5/12 of the length of the second edge 1102. Therefore, a distance between two closest edges of adjacent two first color sub-pixel blocks is larger than ⅙ of the length of the second edge.

For example, in some examples, a distance between the center of the first color sub-pixel block and the first edge is 9/16 to 11/16 of the length of the second edge. Thus, distribution uniformity of first color sub-pixel blocks can be further improved, so as to further improve visual resolution and further improve display quality.

For example, in some examples, the distance between the center of the first color sub-pixel block and the first edge is ⅝ of the length of the second edge. Thus, distribution uniformity of first color sub-pixel blocks can be further improved, so as to further improve visual resolution and further improve display quality.

For example, in some examples, the above-described virtual rectangle may be a square, that is to say, the first edge and the second edge are equal in length.

For example, in some examples, as illustrated by FIG. 1, each of the plurality of minimum repeating regions 100 further includes a second virtual rectangle 120, a third virtual rectangle 130 and a fourth virtual rectangle 140. The first virtual rectangle 110, the second virtual rectangle 120, the third virtual rectangle 130 and the fourth virtual rectangle 140 form a 2*2 matrix in an edge-sharing manner to constitute one of the plurality of minimum repeating regions 100; the second virtual rectangle 120 shares the first edge 1101 with the first virtual rectangle, and is mirror-symmetrical to the first virtual rectangle with respect to the first edge 1101; the first virtual rectangle 110 coincides with the third virtual rectangle 130 by shifting a distance of a length of a diagonal line of the first virtual rectangle 110 along the diagonal line; the third virtual rectangle 130 includes a third edge 1303 extending in the first direction, and the fourth virtual rectangle 140 shares the third edge 1303 with the third virtual rectangle 130, and is mirror-symmetrical to the third virtual rectangle 130 with respect to the third edge 1303. It should be noted that, the first virtual rectangle, the second virtual rectangle, the third virtual rectangle and the fourth virtual rectangle are closely arranged to form the minimum repeating region having a rectangular shape. It should be noted that, the above-described word "coincide"

refers to that three sub-pixel blocks in the third virtual rectangle have same shapes and positions as the three sub-pixel blocks in the first virtual rectangle translated along the diagonal line of the first virtual rectangle for the length of the diagonal line. Here, the word "coincide" only refers to that the pixel blocks coincide with each other, while other structures may be different or the same. In addition, the above-described word "coincide" refers to that approximate positions, shapes and sizes only have to be similar; and in some cases, the shapes may be slightly different for the sake of wiring or opening, for example, opening at different positions. Furthermore, corresponding sub-pixels or sub-pixel blocks or other components in virtual rectangles only need to have at least 70% of an area overlapped so as to be deemed to "coincide" as described in the present disclosure; and corresponding sub-pixels or sub-pixel blocks in virtual rectangles only need to have at least 70% of an area overlapped after a mirroring operation so as to be deemed to "be mirror-symmetrical" as described in the present disclosure.

In the pixel arrangement structure provided by this embodiment, the second virtual rectangle is mirror-symmetrical to the first virtual rectangle, a structure of the third virtual rectangle is the same as a structure of the first virtual rectangle translated along the diagonal line of the first virtual rectangle, the fourth virtual rectangle is mirror-symmetrical to the third virtual rectangle; a distance between a center of a first color sub-pixel block in the third virtual rectangle and the third edge is ½ to ¾ of the length of the second edge, and a distance between a center of a first color sub-pixel block in the fourth virtual rectangle and the third edge is ½ to ¾ of the length of the second edge, so a distance between the center of the first color sub-pixel block in the third virtual rectangle and the center of the first color sub-pixel block in the fourth virtual rectangle is greater than ½ of the length of the second edge, which, thus, can avoid a case where adjacent two first color sub-pixel blocks are difficult to distinguish and are visually combined into one by human eyes due to a closer distance between the adjacent first color sub-pixel blocks, so that granular sensation generated thereby can be avoided. Thus, the pixel arrangement structure can improve distribution uniformity of first color sub-pixel blocks, so as to improve visual resolution and also improve display quality.

In addition, as illustrated by FIG. 1, the distance between the center of the first color sub-pixel block in the first virtual rectangle and the first edge is ½ to ¾ of the length of the second edge, the distance between the center of the first color sub-pixel block in the fourth virtual rectangle and the third edge is ½ to ¾ of the length of the second edge, and a slope between a connecting line between the first color sub-pixel block in the first virtual rectangle and the first color sub-pixel block in the fourth virtual rectangle is relatively low; so upon pixel units belonging to a same row (for example, the first virtual rectangle and the fourth virtual rectangle) collectively displaying a straight line, because the slope of the connection line between the first color sub-pixel block in the first virtual rectangle and the first color sub-pixel block in the fourth virtual rectangle is relatively low, a fluctuation range of the first color sub-pixel block in the first virtual rectangle and the first color sub-pixel block in the fourth virtual rectangle is relatively small, which, thus, can avoid a case where two straight lines displayed by adjacent rows are difficult to distinguish and are visually combined into one by human eyes due to mutual occlusion of the two straight lines resulted from a relatively large fluctuation range. Thus, the pixel arrangement structure can improve visual resolution.

In addition, in the pixel arrangement structure, the second virtual rectangle is mirror-symmetrical to the first virtual rectangle, the structure of the third virtual rectangle is the same as the structure of the first virtual rectangle translated along the diagonal line of the first virtual rectangle, and the fourth virtual rectangle is mirror-symmetrical to the third virtual rectangle, which can improve distribution uniformity of sub-pixels in the pixel arrangement structure, and can also avoid formation of a color line. In addition, within the minimum repeating region 100, there is no color mixing problem in same color sub-pixels, and a second color sub-pixel block 112 in the first virtual rectangle 110 is closer to a second color sub-pixel block 112 in the second virtual rectangle 120, so upon the pixel arrangement structure being applied to an organic light-emitting display device, a light-emitting layer of the second color sub-pixel block 112 in the first virtual rectangle 110 and a light-emitting layer of the second color sub-pixel block 112 in the second virtual rectangle 120 may be formed through the same opening on a mask plate; similarly, upon the pixel arrangement structure being applied to an organic light-emitting display device, because a third color sub-pixel block 113 in the first virtual rectangle 110 is closer to a third color sub-pixel block 113 in the second virtual rectangle 120, a light-emitting layer of the third color sub-pixel block 113 in the first virtual rectangle 110 and a light-emitting layer of the third color sub-pixel block 113 in the second virtual rectangle 120 may also be formed through the same opening on a mask.

For example, in some examples, the first color sub-pixel block 111, the second color sub-pixel block 112 and the third color sub-pixel block 113 in the second virtual rectangle 120 may constitute one pixel unit for color display; the first color sub-pixel block 111, a second color sub-pixel block 112 and a third color sub-pixel block 113 in the third virtual rectangle 130 may constitute one pixel unit for color display; and the first color sub-pixel block 111, a second color sub-pixel block 112 and a third color sub-pixel block 113 in the fourth virtual rectangle 140 may constitute one pixel unit for color display.

In the pixel arrangement structure provided by this embodiment, because the second color sub-pixel block and the third color sub-pixel block are distributed on two sides of the perpendicular bisector of the first edge, and the center of the first color sub-pixel block is located on the perpendicular bisector of the first edge and the distance between the center of the first color sub-pixel block and the first edge which is ½ to ¾ of the length of the second edge; a distance between centers of adjacent two first color sub-pixel blocks is larger than ½ of the length of the second edge, which, thus, can avoid a case where the adjacent two first color sub-pixel blocks are difficult to distinguish and are visually combined into one by human eyes due to a closer distance between the adjacent first color sub-pixel blocks, so that granular sensation generated thereby can be avoided. Thus, the pixel arrangement structure can improve distribution uniformity of first color sub-pixel blocks, so as to improve visual resolution and also improve display quality.

For example, in some examples, as illustrated by FIG. 1, within the first virtual rectangle 110, the second color sub-pixel block 112 and the third color sub-pixel block 113 are respectively close to two ends of the first edge 1101. It should be noted that, according to the above-described relationship of the second virtual rectangle, the third virtual rectangle and the fourth virtual rectangle with the first virtual rectangle, a positional relationship between the second color sub-pixel block and the third color sub-pixel block in the second virtual rectangle, the third virtual rectangle and the fourth virtual rectangle also change accordingly. For example, as illustrated by FIG. 1, in the fourth virtual rectangle 140, a distance between the center of the first color sub-pixel block 111 and an upper edge of the fourth virtual rectangle 140 (equivalent to the first edge 1101 in the first virtual rectangle 110) is ½ to ¾ of the length of the second edge.

For example, in some examples, as illustrated by FIG. 1, within the first virtual rectangle 110, edges of the second color sub-pixel block 112 and the third color sub-pixel block 113 that are away from a center of the first virtual rectangle 110 are located on the first edge, so that space within the first virtual rectangle can be utilized to the greatest extent. It should be noted that, according to the above-described relationship of the second virtual rectangle, the third virtual rectangle and the fourth virtual rectangle with the first virtual rectangle, the positional relationship between the second color sub-pixel block and the third color sub-pixel block in the second virtual rectangle, the third virtual rectangle and the fourth virtual rectangle also change accordingly.

For example, in some examples, as illustrated by FIG. 1, shortest distances among the first color sub-pixel block 111, the second color sub-pixel block 112 and the third color sub-pixel block 113 are equal to one another. That is to say, a shortest distance between the first color sub-pixel block 111 and the second color sub-pixel block 112, a shortest distance between the first color sub-pixel block 111 and the third color sub-pixel block 113, and a shortest distance between the second color sub-pixel block 112 and the third color sub-pixel block 113 are equal to one another, so that process precision can be utilized to the greatest extent.

For example, in some examples, as illustrated by FIG. 1, the shape of the second color sub-pixel block 112 is the same as the shape of the third color sub-pixel block 113, and the shape of the second color sub-pixel block 112 and the shape of the third color sub-pixel block 113 are symmetrical to each other with respect to a diagonal line of the shape of the first color sub-pixel block 111, which is located between right angles formed by a first connection line and a second connection line. Thus, symmetry and uniformity of the pixel arrangement structure may be further improved, so as to further improve display quality.

For example, in some examples, as illustrated by FIG. 1, the shape of the first color sub-pixel block 111 is a right-base-angle symmetrical pentagon; the right-base-angle symmetrical pentagon is symmetrical with respect to the perpendicular bisector of the first edge 1101; and a base of the right-base-angle symmetrical pentagon is parallel to the first edge 1101 or is located on the first edge 1101, and is further away from the first edge 1101 than a vertex of the right-base-angle symmetrical pentagon in a direction perpendicular to the first edge 1101. As illustrated by FIG. 1, two oblique edges of the first color sub-pixel block 111 may be provided respectively opposite to the second color sub-pixel block 112 and the third color sub-pixel block 113, so that in a case where process precision is constant, that is to say, in a case where distances from the first color sub-pixel block 111 respectively to the second color sub-pixel block 112 and the third color sub-pixel block 113 are constant, an area of the first color sub-pixel block 111 is increased. Thus, the pixel arrangement structure can improve a utilization ratio of space within the first virtual rectangle. It should be noted that, the above-described expression "be provided opposite" refers to that the two oblique edges of the first color sub-pixel block 111 respectively face the second color sub-pixel block 112 and the third color sub-pixel block 113.

For example, in some examples, as illustrated by FIG. 1, the shapes of the second color sub-pixel block 112 and the third color sub-pixel block 113 are both right-base-angle symmetrical pentagons; the right-base-angle symmetrical pentagons are symmetrical to each other with respect to the perpendicular bisector of the first edge; and bases of the right-base-angle symmetrical pentagons are parallel to the first edge 1101 or are located on the first edge 1101, and are closer to the first edge 1101 than the vertexes of the right-base-angle symmetrical pentagons in the direction perpendicular to the first edge 1101. As illustrated by FIG. 1, oblique edges of the second color sub-pixel block 112 and the third color sub-pixel block 113 that are close to the first color sub-pixel block 111 may be respectively opposite to the first color sub-pixel block 111, so that in a case where process precision is constant, that is to say, in the case where the distances from the first color sub-pixel block 111 respectively to the second color sub-pixel block 112 and the third color sub-pixel block 113 are constant, areas of the second color sub-pixel block 112 and the third color sub-pixel block 113 are increased. Thus, the pixel arrangement structure can improve the utilization ratio of the space within the first virtual rectangle.

For example, a distance between adjacent edges of two first color sub-pixel blocks is greater than or equal to 12 microns, or greater than or equal to 14 microns. As illustrated by FIG. 1, two first color sub-pixel blocks in each minimum repeating region, for example, refer to one first color sub-pixel block in a fourth virtual rectangle 140 and one first color sub-pixel block in a third virtual rectangle 130. Adjacent edges of the two first color sub-pixel blocks are just an edge of a lower side of the upper first color sub-pixel block and an edge of an upper side of the lower first color sub-pixel block. The above-described distance between the two first color sub-pixel blocks can be set to different numerical values according to different resolution conditions. For example, the distance between the adjacent edges of the two first color sub-pixel blocks is greater than or equal to 12 microns in a case of quarter full high definition resolution, and is greater than or equal to 14 microns in a case of full high definition resolution.

It should be noted that, although the shapes of the sub-pixel blocks shown in the drawings include a corner strictly formed by two straight lines, in some embodiments, the shapes of the sub-pixel blocks may be rounded shapes, that is, corners of the shapes of the sub-pixel blocks are rounded. For example, the light emitting layer can be formed by an evaporation process through a mask, and therefore, a corner portion thereof can be a rounded shape.

Figure 2:
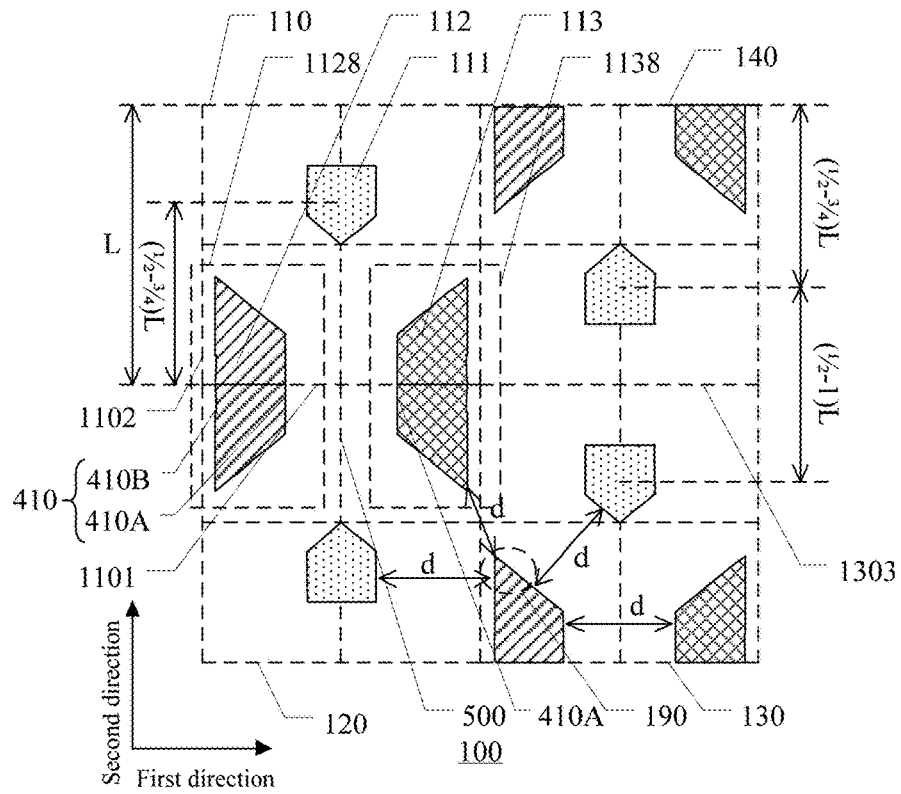
FIG. 2 is a schematic diagram of another pixel arrangement structure provided by an embodiment of the present disclosure.

FIG. 2 is a schematic diagram of another pixel arrangement structure provided by an embodiment of the present disclosure. As illustrated by FIG. 2, shapes of a second color sub-pixel block 112 and a third color sub-pixel block 113 are both right-angled trapezoids; bases of the right-angled trapezoids are perpendicular to a first edge 1101; and a distance between a right-angle edge of the right-angled trapezoid and the first edge 1101 is smaller than a distance between an oblique edge of the right-angled trapezoid and the first edge 1101. As illustrated by FIG. 2, the oblique edges of the second color sub-pixel block 112 and the third color sub-pixel block 113 may be respectively opposite to a first color sub-pixel block 111, so that in a case where process precision is constant, that is to say, in a case where distances from the first color sub-pixel block 111 respectively to the second color sub-pixel block 112 and the third color sub-pixel block 113 are constant, areas of the second color sub-pixel block 112 and the third color sub-pixel block 113 are increased. Thus, the pixel arrangement structure can improve a utilization ratio of space within a first virtual rectangle. Moreover, because the shapes of the second color sub-pixel block 112 and the third color sub-pixel block 113 are both right-angled trapezoids: as compared with a case where the shapes of the second color sub-pixel block 112 and the third color sub-pixel block 113 are both right-base-angle symmetrical pentagons, acute angle portions 190 of the second color sub-pixel block 112 and the third color sub-pixel block 113 may further increase the areas of the second color sub-pixel block 112 and the third color sub-pixel block 113, so as to further improve the utilization ratio of the space within the first virtual rectangle.

For example, in some examples, as illustrated by FIG. 2, a shape of the first color sub-pixel block 111 is a right-base-angle symmetrical pentagon; the right-base-angle symmetrical pentagon is symmetrical with respect to a perpendicular bisector of the first edge; a base of the right-base-angle symmetrical pentagon is parallel to the first edge 1101, and is further away from the first edge than a vertex of the right-base-angle symmetrical pentagon in a direction perpendicular to the first edge; the right-base-angle symmetrical pentagon includes a third oblique edge 193 and a fourth oblique edge 194 passing through the vertex of the right-base-angle symmetrical pentagon; the third oblique edge 193 and the fourth oblique edge 194 are equal in length; the third oblique edge 193 of the first color sub-pixel block 111 and the oblique edge of the second color sub-pixel block 112 are parallel to each other and have a spacing of a fifth distance; and the fourth oblique edge 194 of the first color sub-pixel block 111 and the oblique edge of the third color sub-pixel block are parallel to each other and have a spacing of a sixth distance.

For example, in some examples, as illustrated by FIG. 2, within a first virtual rectangle 110 and a second virtual rectangle 120, third color sub-pixel blocks 113 are closer to a center of a minimum repeating region 100 than second color sub-pixel blocks 112; within a third virtual rectangle 130 and a fourth virtual rectangle 140, second color sub-pixel blocks 112 are closer to the center of the minimum repeating region 100 than third color sub-pixel blocks 113; a third color sub-pixel block 113 in the first virtual rectangle 110 is adjacent to a second color sub-pixel block 112 in the fourth virtual rectangle 140; a third color sub-pixel block 113 in the second virtual rectangle 120 is adjacent to a second color sub-pixel block 112 in the third virtual rectangle 130; a spacing between an acute angle portion 190 of the third color sub-pixel block 113 in the first virtual rectangle 110 and an acute angle portion 190 of the second color sub-pixel block 112 in the fourth virtual rectangle 140 is a seventh distance; and a spacing between an acute angle portion 190 of the third color sub-pixel block 113 in the second virtual rectangle 120 and an acute angle portion 190 of the second color sub-pixel block 112 in the third virtual rectangle 130 is an eighth distance.

For example, in some examples, as illustrated by FIG. 2, the fifth distance, the sixth distance, the seventh distance and the eighth distance are all equal to one another.

For example, as illustrated in FIG. 2, a distance between a third color sub-pixel block and a first color sub-pixel block that are adjacent to each other is equal to a distance between a third color sub-pixel block and a second color sub-pixel block that are adjacent to each other, both being distance d. In some examples, a distance between a first color sub-pixel block and a second color sub-pixel block that are adjacent to each other is also equal to the above-described distance d.

For example, in some examples, as illustrated by FIG. 2, the second color sub-pixel block and the third color sub-pixel block may also have an asymmetrical shape which, for example, is asymmetrical with respect to a straight line passing through its center in a second direction.

Figure 3:
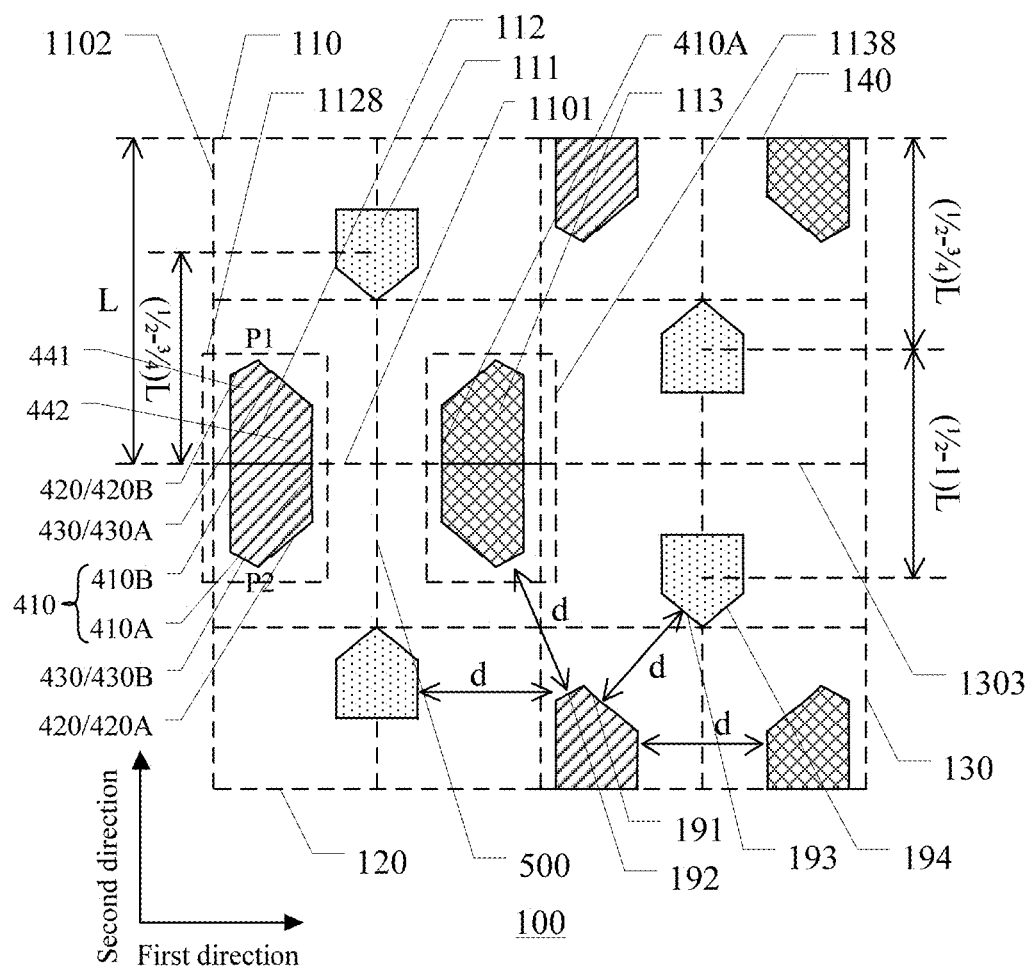
FIG. 3 is a schematic diagram of another pixel arrangement structure provided by an embodiment of the present disclosure.

FIG. 3 is a schematic diagram of another pixel arrangement structure provided by an embodiment of the present disclosure. As illustrated by FIG. 3, shapes of a second color sub-pixel block 112 and a third color sub-pixel block 113 are both right-base-angle pentagons; bases of the right-base-angle pentagons are parallel to a first edge 1101 or are located on the first edge 1101, and are closer to the first edge 1101 than vertexes of the right-base-angle pentagons in a direction perpendicular to the first edge 1101; the right-base-angle pentagon includes a first oblique edge 191 and a second oblique edge 192 passing through the vertex; the first oblique edge 191 is opposite to a first color sub-pixel block 111; and a length of the first oblique edge 191 is larger than a length of the second oblique edge 192. For example, a first oblique edge 191 of the second color sub-pixel block 112 is opposite to the first color sub-pixel block 111, and a first oblique edge 191 of the third color sub-pixel block 113 is opposite to the first color sub-pixel block 111, so that in a case where process precision is constant, that is to say, in a case where distances from the first color sub-pixel block 111 respectively to the second color sub-pixel block 112 and the third color sub-pixel block 113 are constant, areas of the second color sub-pixel block 112 and the third color sub-pixel block 113 are increased, so as to improve a utilization ratio of space within a first virtual rectangle. Moreover, because the shapes of the second color sub-pixel block 112 and the third color sub-pixel block 113 are both right-base-angle pentagons: as compared with a case where the shapes of the second color sub-pixel block 112 and the third color sub-pixel block 113 are both right-base-angle symmetrical pentagons, regions where the second oblique edges 192 of the second color sub-pixel block 112 and the third color sub-pixel block 113 are located may further increase the areas of the second color sub-pixel block 112 and the third color sub-pixel block 113, so as to further improve the utilization ratio of the space within the first virtual rectangle; and as compared with a case where the shapes of the second color sub-pixel block 112 and the third color sub-pixel block 113 are both right-angled trapezoids, the second oblique edges 192 of the second color sub-pixel block 112 and the third color sub-pixel block 113 can have a fabrication difficulty reduced, and in case where a technological level is relatively low, the shapes of the second color sub-pixel block and the third color sub-pixel block may be right-base-angle pentagons.

For example, a ratio of a length of an orthographic projection of the first oblique edge 191 in the first direction and a length of an orthographic projection of the second oblique edge 192 in the first direction is in a range of 2-6. Thus, a brightness center of the third color sub-pixel block is closer to the first color sub-pixel block, so as to reduce the risk of color separation.

For example, in some examples, as illustrated by FIG. 3, a shape of the first color sub-pixel block 111 is a right-base-angle symmetrical pentagon; the right-base-angle symmetrical pentagon is symmetrical with respect to a line parallel to the second direction and passing through the first edge; a base of the right-base-angle symmetrical pentagon is parallel to the first edge or is located on the first edge, and is further away from the first edge than the vertex of the right-baseangle symmetrical pentagon in the direction perpendicular to the first edge; the right-base-angle symmetrical pentagon includes a third oblique edge 193 and a fourth oblique edge 194 passing through the vertex of the right-base-angle symmetrical pentagon; the third oblique edge 193 and the fourth oblique edge 194 are equal in length; the third oblique edge 193 of the first color sub-pixel block 111 and the first oblique edge 191 of the second color sub-pixel block 112 are parallel to each other and have a spacing of a first distance; and the fourth oblique edge 194 of the first color sub-pixel block 111 and the first oblique edge 191 of the third color sub-pixel block are parallel to each other and have a spacing of a second distance. It should be noted that, the above-described case of "being parallel" includes a case of being substantially parallel; and the above-described distance refers to a minimum distance, or a distance between two intersection points formed as a line connecting centers of two sub-pixels respectively intersects with two closest edges of the two sub-pixels.

For example, in some examples, as illustrated by FIG. 3, within the first virtual rectangle 110 and a second virtual rectangle 120, third color sub-pixel blocks 113 are closer to a center of a minimum repeating region 100 than second color sub-pixel blocks 112; within a third virtual rectangle 130 and a fourth virtual rectangle 140, second color sub-pixel blocks 112 are closer to the center of the minimum repeating region 100 than third color sub-pixel blocks 113; the third color sub-pixel block 113 in the first virtual rectangle 110 is adjacent to a second color sub-pixel block 112 in the fourth virtual rectangle 140; a third color sub-pixel block 113 in the second virtual rectangle 120 is adjacent to a second color sub-pixel block 112 in the third virtual rectangle 130; the second oblique edge 192 of the third color sub-pixel block 113 in the first virtual rectangle 110 and a second oblique edge 192 of the second color sub-pixel block 112 in the fourth virtual rectangle 140 are parallel to each other and have a spacing of a third distance; and a second oblique edge 192 of the third color sub-pixel block 113 in the second virtual rectangle 120 and a second oblique edge 192 of the second color sub-pixel block 112 in the third virtual rectangle 130 are parallel to each other and have a spacing of a fourth distance.

For example, in some examples, the first distance, the second distance, the third distance and the fourth distance as described above are all equal to one another, so that a utilization ratio of process precision can be improved, within the same one of the plurality of repeating region, the second color sub-pixel block of the first block group and the second color sub-pixel block of the third block group are integrated to form a second unitary sub-pixel block; within two adjacent ones of the plurality of repeating regions in a direction perpendicular to the first virtual line, the two adjacent ones of the plurality of repeating regions comprise a first repeating region and a second repeating region sequentially arranged in the direction perpendicular to the first virtual line; and the second color sub-pixel block of the fourth block group of the first repeating region and the second color sub-pixel block of the second block group of the second repeating region are integrated to form a second unitary sub-pixel block.

Figure 4A:
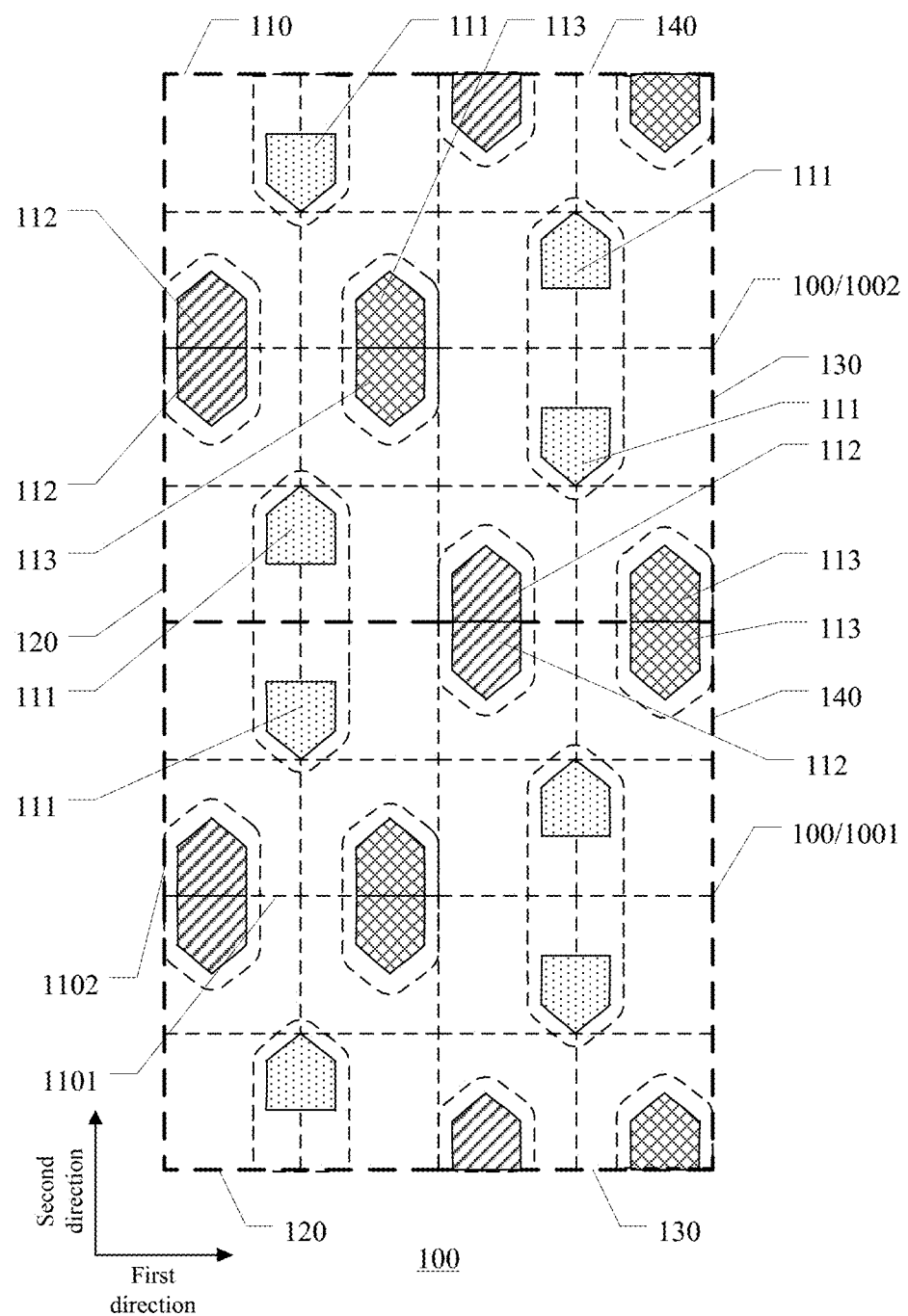
FIG. 4A is a schematic diagram of another pixel arrangement structure provided by an embodiment of the present disclosure.

For example, as illustrated by FIG. 1 and FIG. 4A, within the same one of the plurality of repeating region 100, the second color sub-pixel block 112 of the first block group G110 and the second color sub-pixel block 112 of the third block group G130 are integrated to form a second unitary sub-pixel block 1128; within two adjacent ones of the plurality of repeating regions 100 in a direction perpendicular to the first virtual line 301, the two adjacent ones of the plurality of repeating regions 100 include a first repeating region 1001 and a second repeating region 1002 sequentially arranged in the direction perpendicular to the first virtual line 301; and the second color sub-pixel block 112 of the fourth block group G140 of the first repeating region 1001 and the second color sub-pixel block 112 of the second block group G120 of the second repeating region 1002 are integrated to form a second unitary sub-pixel block 1128.

For example, as illustrated by FIG. 1 and FIG. 4A, within the same one of the plurality of repeating region 100, the third color sub-pixel block 113 of the first block group G110 and the third color sub-pixel block 113 of the third block group G130 are integrated to form a third unitary sub-pixel block 1138; the third color sub-pixel block 113 of the fourth block group G110 of the first repeating region 1001 and the third color sub-pixel block 113 of the second block group G120 of the second repeating region 1002 are integrated to form a third unitary sub-pixel block 1138.

For example, as illustrated by FIG. 1 and FIG. 4A, a distance between a vertex of the first protrusion 111P of the first color sub-pixel block 111 of the second block group G120 and a vertex of the first protrusion 111P of the first color sub-pixel block 111 of the fourth block group G140 is larger than a length of the second unitary sub-pixel block 1128 in a direction perpendicular to the first virtual line 301 and a length of the third unitary sub-pixel block 1138 in a direction perpendicular to the first virtual line 301.

For example, as illustrated by FIG. 1 and FIG. 4A, the distance between a vertex of the first protrusion 111P of the first color sub-pixel block 111 of the second block group G120 and a vertex of the first protrusion 111P of the first color sub-pixel block 111 of the fourth block group G140 is smaller or equal to a distance between the first virtual line 301 and the second virtual line 302.

For example, the vertex of the first protrusion of the first color sub-pixel block of the second block group is located on a first middle virtual line, the first middle virtual line is located between the first virtual line and the second virtual line, and has the same distance with the first virtual line and the second virtual line, the vertex of the first protrusion of the first color sub-pixel block of the fourth block group is located on a second middle virtual line, the second middle virtual line is located between the second virtual line and the third virtual line, and has the same distance with the second virtual line and the third virtual line.

For example, as illustrated by FIG. 1, the shape of the first color sub-pixel block 111 includes an oblique edge, being not parallel to the first virtual line or a direction perpendicular to the first virtual line, the shape of the second color sub-pixel block 112 includes an oblique edge, being not parallel to the first virtual line or a direction perpendicular to the first virtual line, the shape of the third color sub-pixel block 113 includes an oblique edge, being not parallel to the first virtual line or a direction perpendicular to the first virtual line, the oblique edge of a first one of the first color sub-pixel block 111, the second color sub-pixel block 112, and the third color sub-pixel block 113 is substantially parallel to the oblique edge of a second one of the first color sub-pixel block 111, the second color sub-pixel block 112, and the third color sub-pixel block 113, which is adjacent to the first one of the first color sub-pixel block 111, the second color sub-pixel block 112, and the third color sub-pixel block 113.

FIG. 4A is a schematic diagram of another pixel arrangement structure provided by an embodiment of the present disclosure. FIG. 4A shows two minimum repeating regions 100; as illustrated by FIG. 4A, within the same minimum repeating region 100, a second color sub-pixel block 112 of a first virtual rectangle 110 and a second color sub-pixel block 112 of a second virtual rectangle 120 are combined into a same sub-pixel, i.e., a second unitary sub-pixel block 112S; within two minimum repeating regions 100 adjacent to each other in a second direction, the adjacent two minimum repeating regions 100 in the second direction include a first minimum repeating region 1001 and a second minimum repeating region 1002 sequentially arranged in the second direction; and a second color sub-pixel block 112 of a fourth virtual rectangle 140 of the first minimum repeating region 1001 and a second color sub-pixel block 112 of a third virtual rectangle 130 of the second minimum repeating region 1002 are combined into a same sub-pixel, i.e., i.e., a second unitary sub-pixel block 112S. Thus, combination of second color sub-pixel blocks into a same sub-pixel can reduce difficulty in manufacturing process of the second color sub-pixel blocks. In addition, upon the pixel arrangement structure being used in a display panel, it may be driven by using a Sub-pixel Rendering (SPR) algorithm to implement virtual display.

In some examples, in each of the second unitary sub-pixel block, a distance between centers of the two second color sub-pixel blocks is 0.1-0.5 times of a length of the first edge, so as to reduce the risk of color separation.

In some examples, in each of the second unitary sub-pixel block, a distance between centers of the two second color sub-pixel blocks is 0.1-0.35 times of a length of the first edge, so as to reduce the risk of color separation.

For example, in each of the second unitary sub-pixel block, the distance between centers of the two second color sub-pixel blocks is 0.2-0.3 times (for example, 0.27 times) of the length of the first edge, so as to further reduce the risk of color separation.

For example, a length a length-width ratio of the second unitary sub-pixel block is 1-8, so as to further reduce the risk of color separation. It should be noted that, the length-width ratio is a ratio of a length of a shape to a width of the shape. Besides, a length of the shape can be a size of the shape in the second direction, and a width of the shape can be a size of the shape in the first direction. Or, a length of the shape can be a largest size of the shape, and a width of the shape can be a smallest size of the shape.

For example, a length-width ratio of the second unitary sub-pixel block is 2-3 (for example, 2.6), so as to further reduce the risk of color separation.

It should be noted that, the second color sub-pixel block of the first virtual rectangle and the second color sub-pixel block of the second virtual rectangle within the same minimum repeating region that are combined into a same sub-pixel, or the second color sub-pixel block of the fourth virtual rectangle of the first minimum repeating region and the second color sub-pixel block of the third virtual rectangle of the second minimum repeating region that are combined into a same sub-pixel as described above are driven to emit light as a same sub-pixel. That is to say, the above-described second color sub-pixel blocks located in different virtual rectangles that are combined into a same sub-pixel serve only as a portion of one sub-pixel, and at this time, a center of the integrated sub-pixel is located on a first edge or on a shared edge of the adjacent two minimum repeating regions in the second direction.

For example, upon the second color sub-pixel block having a shape of right-base-angle symmetrical pentagon, the second unitary sub-pixel block has a shape of hexagon.

For example, in some examples, as illustrated by FIG. 4A, within the same minimum repeating region 100, a third color sub-pixel block 113 of the first virtual rectangle 110 and a third color sub-pixel block 113 of the second virtual rectangle 120 are combined into a same sub-pixel, i.e., a third unitary sub-pixel block 113S; within the two minimum repeating regions 100 adjacent to each other in the second direction, the adjacent two minimum repeating regions 100 in the second direction include the first minimum repeating region 1001 and the second minimum repeating region 1002 sequentially arranged in the second direction; and a third color sub-pixel block 113 of the fourth virtual rectangle 140 of the first minimum repeating region 1001 and a third color sub-pixel block 113 of the third virtual rectangle 130 of the second minimum repeating region 1002 are combined into a same sub-pixel, i.e., a third unitary sub-pixel block 113S. Thus, combination of third color sub-pixel blocks into a same sub-pixel can reduce a difficulty in manufacturing process of the third color sub-pixel blocks. In addition, when the pixel arrangement structure is used in a display panel, it may be driven by using a Sub-pixel Rendering (SPR) algorithm to implement virtual display.

It should be noted that, the third color sub-pixel block of the first virtual rectangle and the third color sub-pixel block of the second virtual rectangle within the same minimum repeating region that are combined into a same sub-pixel, or the third color sub-pixel block of the fourth virtual rectangle of the first minimum repeating region and the third color sub-pixel block of the third virtual rectangle of the second minimum repeating region that are combined into a same sub-pixel as described above are driven to emit light as a same sub-pixel. That is to say, the above-described third color sub-pixel blocks located in different virtual rectangles that are combined into a same sub-pixel serve only as a portion of one sub-pixel, and at this time, a center of the integrated sub-pixel is located on the first edge or on the shared edge of the adjacent two minimum repeating regions in the second direction.

In addition, within the same one of the plurality of minimum repeating regions 100, the second color sub-pixel block 112 of the first virtual rectangle 110 and the second color sub-pixel block 112 of the second virtual rectangle 120 may not be combined into a same sub-pixel; within two adjacent ones of the plurality of minimum repeating regions 100 in the second direction, the two adjacent ones of the plurality of minimum repeating regions 100 in the second direction include a first minimum repeating region 1001 and a second minimum repeating region 1002 sequentially arranged in the second direction; and the second color sub-pixel block 112 of the fourth virtual rectangle 140 of the first minimum repeating region 1001 and the second color sub-pixel block 112 of the third virtual rectangle 130 of the second minimum repeating region 1002 may not be combined into a same sub-pixel. At this time, the second color sub-pixel block 112 of the first virtual rectangle 110 and the second color sub-pixel block 112 of the second virtual rectangle 120 are respectively driven to emit light as two second color sub-pixel blocks, and may share a same single color pattern region in a sub-pixel patterning process. The second color sub-pixel block 112 of the fourth virtual rectangle 140 of the first minimum repeating region 1001 and the second color sub-pixel block 112 of the third virtual rectangle 130 of the second minimum repeating region 1002 are respectively driven to emit light as two second color sub-pixel blocks, and may share a same single color pattern region in a sub-pixel patterning process.

In addition, within the same minimum repeating region 100, the third color sub-pixel block 113 of the first virtual rectangle 110 and the third color sub-pixel block 113 of the second virtual rectangle 120 may not be combined into a same sub-pixel; within the two minimum repeating regions 100 adjacent to each other in the second direction, the adjacent two minimum repeating regions 100 in the second direction include the first minimum repeating region 1001 and the second minimum repeating region 1002 sequentially arranged in the second direction; and the third color sub-pixel block 113 of the fourth virtual rectangle 140 of the first minimum repeating region 1001 and the third color sub-pixel block 113 of the third virtual rectangle 130 of the second minimum repeating region 1002 may not be combined into a same sub-pixel. At this time, the third color sub-pixel block 113 of the first virtual rectangle 110 and the third color sub-pixel block 113 of the second virtual rectangle 120 are respectively driven to emit light as two third color sub-pixel blocks, and may share a same single color pattern region in a sub-pixel patterning process. The third color sub-pixel block 113 of the fourth virtual rectangle 140 of the first minimum repeating region 1001 and the third color sub-pixel block 113 of the third virtual rectangle 130 of the second minimum repeating region 1002 are respectively driven to emit light as two third color sub-pixel blocks, and may share a same single color pattern region in a sub-pixel patterning process. For example, in some examples, as illustrated by FIG. 4A, within the same minimum repeating region 100, a first color sub-pixel block 111 of the third virtual rectangle 130 and a first color sub-pixel block 111 of the fourth virtual rectangle 140 share a same single color pattern region in a sub-pixel patterning process. For example, when the pixel arrangement structure is applied to an organic light-emitting display device, the sub-pixel patterning process includes an evaporation process; and a light-emitting layer of the first color sub-pixel block 111 of the third virtual rectangle 130 and a light-emitting layer of the first color sub-pixel block 111 of the fourth virtual rectangle 140 may be formed through a same opening on a mask. Of course, the above-described sub-pixel patterning process includes, but is not limited to, an evaporation process, and may also include printing, a color filter patterning process, and so on. Thus, the first color sub-pixel block 111 of the third virtual rectangle 130 and the first color sub-pixel block 111 of the fourth virtual rectangle 140 share a same single color pattern region in a sub-pixel patterning process such as printing and a color filter patterning process.

Figure 4B:
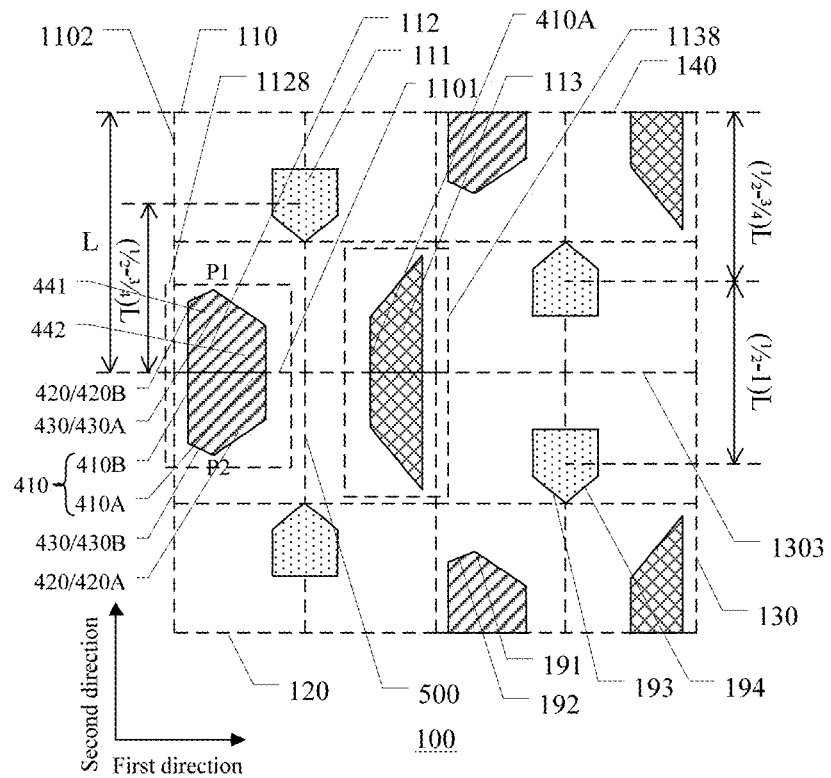
FIG. 4B is a schematic diagram of another pixel arrangement structure provided by an embodiment of the present disclosure.

For example, as illustrated by FIG. 2, FIG. 3, and FIG. 4B, a shape of at least one of the second unitary sub-pixel block 1128 and the third unitary sub-pixel block 1138 includes a parallel edge group 410, the parallel edge group 410 includes two parallel edges 410A, 410B, which are both approximately parallel to one of the first direction and the second direction, and the two parallel edges 410A, 410B have different lengths.

For example, as illustrated by FIG. 2, FIG. 3, and FIG. 4B, the shape of at least one of the second unitary sub-pixel block 1128 and the third unitary sub-pixel block 1138 is approximately symmetrical with respect to a line extending in the other one of the first direction and the second direction.

For example, as illustrated by FIG. 3 and FIG. 4B, a shape of at least one of the second unitary sub-pixel block 1128 and the third unitary sub-pixel block 1138 includes a hexagon, the hexagon includes a parallel edge group 410 including two parallel edges 410A, 410B, a first opposite edge group 420 including two opposite edges 420A, 420B, and a second opposite edge group 430 including two opposite edges 430A, 430B, the two opposite edges 420A, 420B in the first opposite edge group 420 are disposed opposite to each other, the two opposite edges 430A, 430B in the second opposite edge group 430 are disposed opposite to each other, and the two parallel edges 410A, 410B in the parallel edge group 410 have different lengths.

It is to noted that, the opposite edges are edges which are disposed opposite to each other; the opposite edges are not directly adjacent to each other; and the opposite edges may be parallel to each other, or an included angle between extending lines of the opposite edges is smaller than 90 degrees (for example, smaller than 45 degrees). For example, with regard to a hexagon, in a clockwise direction, a first edge, a second edge, a third edge, a fourth edge, a fifth edge, and a sixth edge are sequentially arranged; in this case, the first edge and the fourth edge are the opposite edges, the second edge and the fifth edge are the opposite edges, the third edge and the sixth edge are the opposite edges. For another example, with regard to octagon, in a clockwise direction, a first edge, a second edge, a third edge, a fourth edge, a fifth edge, a sixth edge, a seventh edge, an eighth edge, a ninth edge, and a tenth edge are sequentially arranged; in this case, the first edge and the fifth edge are the opposite edges, the second edge and the sixth edge are the opposite edges, the third edge and the seventh edge are the opposite edges, and the fourth edge and the eighth edge are the opposite edges.

For example, as illustrated by FIG. 3 and FIG. 4B, the hexagon is symmetrical with respect to a line extending in the first direction.

In some examples, within the same one of the plurality of minimum repeating regions 100, the two parallel edges in the parallel edge group of at least one of the second unitary sub-pixel block 1128 and the third unitary sub-pixel block 1138 in the first virtual rectangle 110 and the second virtual rectangle 120 are approximately parallel to the second direction, one of the two parallel edges in the parallel edge group which is close to a center line passing through a center of the first color sub-pixel block 111 in the first virtual rectangle 110 is a first parallel edge 410A, and one of the two parallel edges in the parallel edge group which is away from the center line passing through the center line of the first color sub-pixel block 111 in the first virtual rectangle is a second parallel edge 410B, a length of the first parallel edge 410A is smaller than a length of the second parallel edge 410B; within two adjacent ones of the plurality of minimum repeating regions 100 in the second direction, the two adjacent ones of the plurality of minimum repeating regions 100 comprise a first minimum repeating region 1001 and a second minimum repeating region 1002 sequentially arranged in the second direction; the two parallel edges in the parallel edge group of the second unitary sub-pixel block 1128 and the third unitary sub-pixel block 1138 in the third virtual rectangle 130 of the first minimum repeating region 1001 and the fourth virtual rectangle 140 of the second minimum repeating region 1002 are approximately parallel to the second direction, one of the two parallel edges in the parallel edge group which is close to a center line passing through a center of the first color sub-pixel block 111 in the third virtual rectangle 130 of the first minimum repeating region 1001 is a first parallel edge 410A, and one of the two parallel edges in the parallel edge group which is away from the center line passing through the center line of the first color sub-pixel block 111 in the third virtual rectangle 130 of the first minimum repeating region 1001 is a second parallel edge 410B, a length of the first parallel edge 410A is smaller than a length of the second parallel edge 410B.

However, the embodiments of the present disclosure are not limited thereto. Referring to FIG. 4D, the length of the first parallel edge 410A can also be larger than the length of the second parallel edge 410B.

For example, as illustrated by FIG. 3 and FIG. 4B, the two parallel edges 410A, 410B in the parallel edge group 410 are approximately parallel to the second direction, one of the two parallel edges 410A, 410B in the parallel edge group 410 which is close to a center line 500 passing through a center of the first color sub-pixel block and parallel to the second direction is a first parallel edge 410A, and one of the two parallel edges 410A, 410B in the parallel edge group 410 which is away from the center line passing through the center line 500 of the first color sub-pixel block and parallel to the second direction is a second parallel edge 410B, a length of the first parallel edge 410A is smaller than a length of the second parallel edge 410B. It should be noted that, the center line 500 can be a brightness line of the first color sub-pixel block.

In some examples, a shape of the second unitary sub-pixel block and a shape of the third unitary sub-pixel block both include the hexagon; within the same one of the plurality of minimum repeating regions, a distance between the first parallel edge of the hexagon of the second unitary sub-pixel block in the first virtual rectangle and the second virtual rectangle and the center line of the first color sub-pixel block in the first virtual rectangle is smaller than a distance between the first parallel edge of the hexagon of the third unitary sub-pixel block in the first virtual rectangle and the second virtual rectangle and the center line of the first color sub-pixel block in the first virtual rectangle, and a length of the first parallel edge of the hexagon of the second unitary sub-pixel block in the first virtual rectangle and the second virtual rectangle is smaller than a length of the first parallel edge of the hexagon of the third unitary sub-pixel block in the first virtual rectangle and the second virtual rectangle; or, a distance between the first parallel edge of the hexagon of the second unitary sub-pixel block in the first virtual rectangle and the second virtual rectangle and the center line of the first color sub-pixel block in the first virtual rectangle is larger than a distance between the first parallel edge of the hexagon of the third unitary sub-pixel block in the first virtual rectangle and the second virtual rectangle and the center line of the first color sub-pixel block in the first virtual rectangle, and a length of the first parallel edge of the hexagon of the second unitary sub-pixel block in the first virtual rectangle and the second virtual rectangle is larger than a length of the first parallel edge of the hexagon of the third unitary sub-pixel block in the first virtual rectangle and the second virtual rectangle.

In some examples, within two adjacent ones of the plurality of minimum repeating regions in the second direction, the two adjacent ones of the plurality of minimum repeating regions comprise a first minimum repeating region and a second minimum repeating region sequentially arranged in the second direction; a distance between the first parallel edge of the hexagon of the second unitary sub-pixel block in the third virtual rectangle of the first minimum repeating region and the fourth virtual rectangle of the second minimum repeating region and the center line of the first color sub-pixel block in the third virtual rectangle of the first minimum repeating region is smaller than a distance between the first parallel edge of the hexagon of the third unitary sub-pixel block in the third virtual rectangle of the first minimum repeating region and the fourth virtual rect- angle of the second minimum repeating region and the center line of the first color sub-pixel block in the third virtual rectangle of the first minimum repeating region, and a length of the first parallel edge of the hexagon of the second unitary sub-pixel block in the third virtual rectangle of the first minimum repeating region and the fourth virtual rectangle of the second minimum repeating region is smaller than a length of the first parallel edge of the hexagon of the third unitary sub-pixel block in the third virtual rectangle of the first minimum repeating region and the fourth virtual rectangle of the second minimum repeating region; or, a distance between the first parallel edge of the hexagon of the second unitary sub-pixel block in the third virtual rectangle of the first minimum repeating region and the fourth virtual rectangle of the second minimum repeating region and the center line of the first color sub-pixel block in the third virtual rectangle of the first minimum repeating region is larger than a distance between the first parallel edge of the hexagon of the third unitary sub-pixel block in the third virtual rectangle of the first minimum repeating region and the fourth virtual rectangle of the second minimum repeating region and the center line of the first color sub-pixel block in the third virtual rectangle of the first minimum repeating region, and a length of the first parallel edge of the hexagon of the second unitary sub-pixel block in the third virtual rectangle of the first minimum repeating region and the fourth virtual rectangle of the second minimum repeating region is larger than a length of the first parallel edge of the hexagon of the third unitary sub-pixel block in the third virtual rectangle of the first minimum repeating region and the fourth virtual rectangle of the second minimum repeating region.

For example, as illustrated by FIG. 3 and FIG. 4B, a shape of the second unitary sub-pixel block and a shape of the third unitary sub-pixel block both include the hexagon, a distance between the first parallel edge 410A of the hexagon of the second unitary sub-pixel block 1128 and the center line 500 is smaller than a distance between the first parallel edge 410A of the hexagon of the third unitary sub-pixel block 1138 and the center line 500, and a length of the first parallel edge 410A of the hexagon of the second unitary sub-pixel block 1128 is smaller than a length of the first parallel edge 410A of the hexagon of the third unitary sub-pixel block 1138. Thus, upon the second unitary sub-pixel block emitting red light, the second unitary sub-pixel block can be closer to the center line 500, i.e., a brightness line of the first color sub-pixel block, so as to reduce the grain feeling of vertical line, thus improving the display effect.

Certainly, the embodiments of the present disclosure include but are not limited thereto. Referring to FIG. 4E, A distance between the first parallel edge 410A of the hexagon of the second unitary sub-pixel block 1128 and the center line can be larger than a distance between the first parallel edge 410A of the hexagon of the third unitary sub-pixel block 113 and the center line, and a length of the first parallel edge 410A of the hexagon of the second unitary sub-pixel block 1128 can be larger than a length of the first parallel edge 410A of the hexagon of the third unitary sub-pixel block 1138.

Figure 4C:
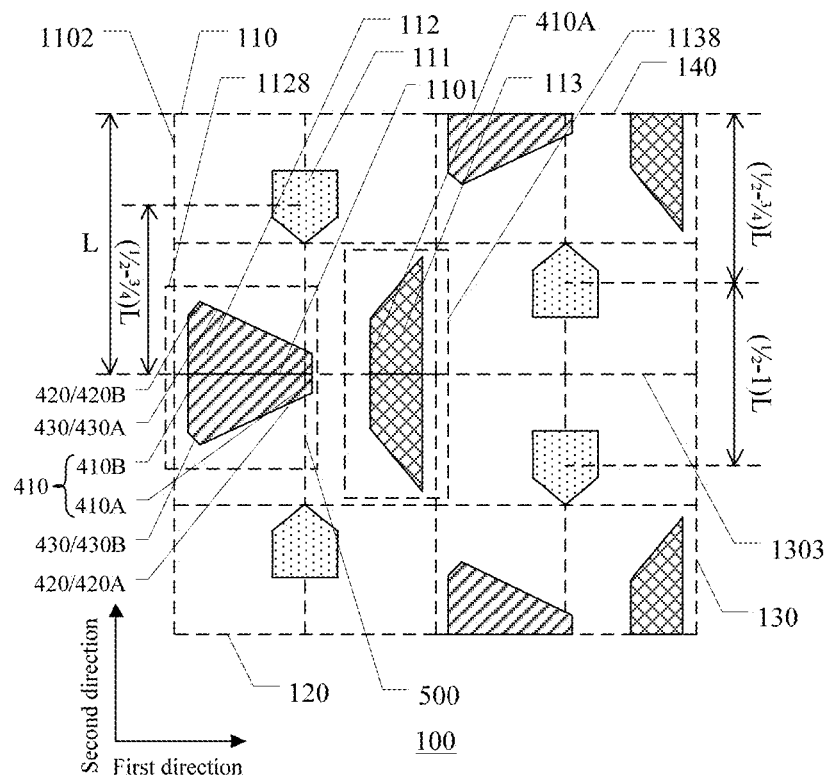
FIG. 4C is a schematic diagram of another pixel arrangement structure provided by an embodiment of the present disclosure.
Figure 4D:
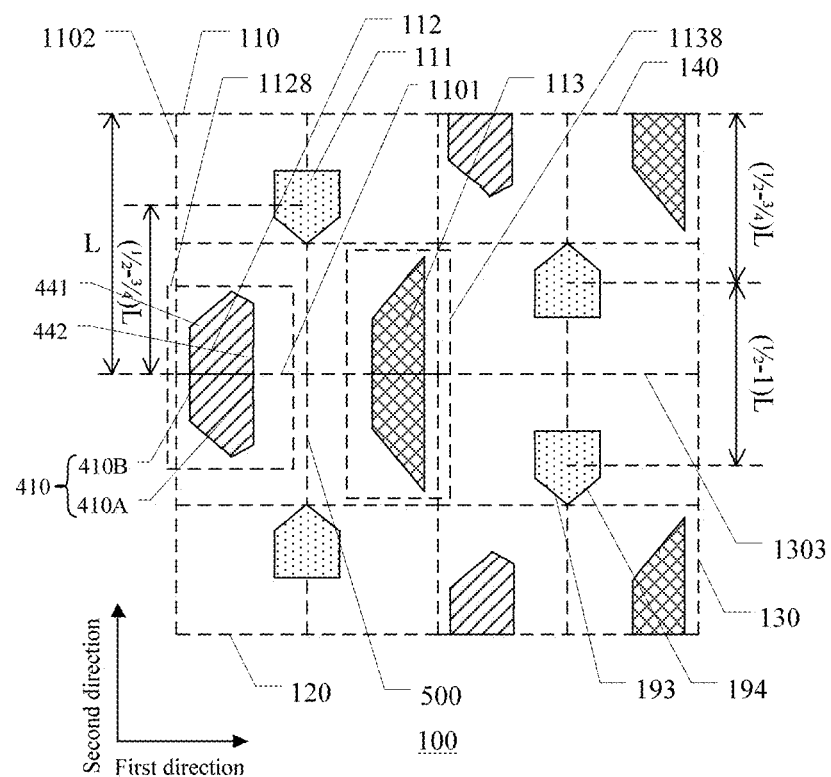
FIG. 4D is a schematic diagram of another pixel arrangement structure provided by an embodiment of the present disclosure.
Figure 4E:
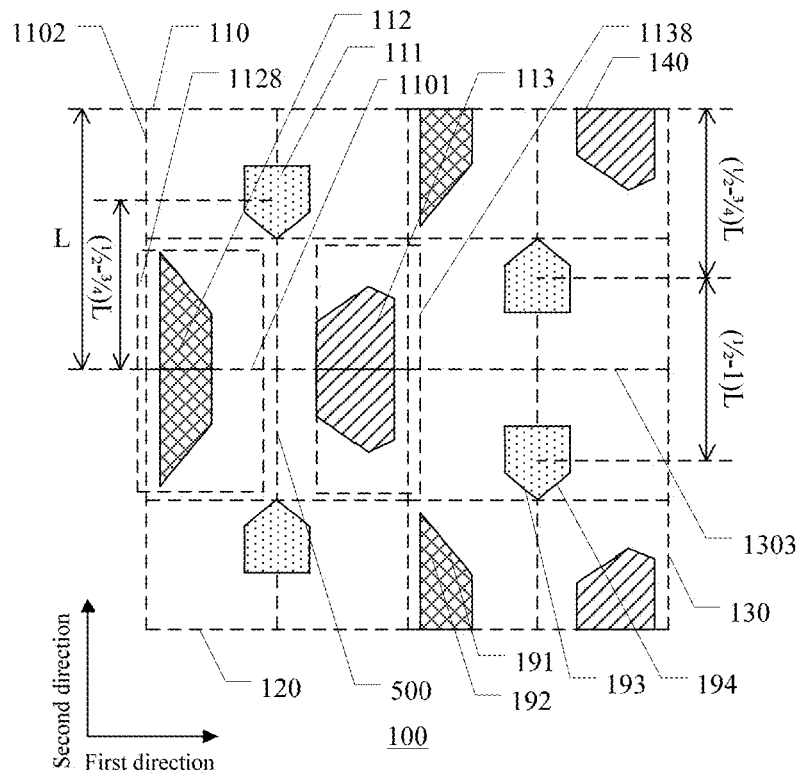
FIG. 4E is a schematic diagram of another pixel arrangement structure provided by an embodiment of the present disclosure.

For example, as illustrated by FIG. 4C, a shape of the second unitary sub-pixel block 1128 and a shape of the third unitary sub-pixel block 1138 both include the hexagon, the first parallel edge of the hexagon of the second unitary sub-pixel block in the first virtual rectangle 120 and the second virtual rectangle 130 goes beyond the center line of the first color sub-pixel block 111 in the first virtual rectangle 110. Thus, upon the second unitary sub-pixel block emits red light, the second unitary sub-pixel block can be closer to the center line 500, i.e., a brightness line of the first color sub-pixel block, so as to reduce the grain feeling of vertical line, thus improving the display effect. However, the embodiments of the present disclosure include but are not limited thereto, the first parallel edge of the hexagon of the third unitary sub-pixel block in the first virtual rectangle and the second virtual rectangle goes beyond the center line of the first color sub-pixel block in the first virtual rectangle.

For example, as illustrated by FIG. 2, FIG. 3 and FIG. 4B, the shape of at least one of the second unitary sub-pixel block 1128 and the third unitary sub-pixel block 1138 includes a polygon, for example, a hexagon, the polygon includes two vertexes P1, P2 which have the largest distance in the second direction, and a line connecting the two vertexes P1, P2 is approximately parallel to the second direction.

For example, as illustrated by FIG. 2, FIG. 3 and FIG. 4B, in the polygon of at least one of the second unitary sub-pixel block 1128 and the third unitary sub-pixel block 1138, an area of a first portion 441 located at a first side (for example, the left side) of the line connecting the two vertexes P1, P2 is different from an area of a second portion 442 located at a second side (for example, the right side) of the line connection the two vertexes P1, P2.

For example, as illustrated by FIG. 2, FIG. 3 and FIG. 4B, the first portion 441 is located at a side close to the first color sub-pixel block 111 located in the same virtual rectangle, and the second portion 442 is located at a side away from the first color sub-pixel block 111 located in the same virtual rectangle.

For example, as illustrated by FIG. 2, FIG. 3 and FIG. 4B, a ratio of the area of the first portion 441 and the area of the second portion 442 is in a range of 0-1. For example, a ratio of the area of the first portion 441 to the area of the second portion 442 is in a range of 0-1; for another example, a ratio of the area of the second portion 442 and the area of the first portion 441 is in a range of 0-1.

For example, as illustrated by FIG. 2, FIG. 3 and FIG. 4B, a width of the first portion 441 in the first direction is different from a width of the second portion 442 in the second direction.

For example, as illustrated by FIG. 2, FIG. 3 and FIG. 4B, a ratio of the width of the first portion 441 in the first direction and the width of the second portion 442 in the second direction is 0.1-6.

For example, upon the third color sub-pixel block having a shape of right-base-angle symmetrical pentagon, the third unitary sub-pixel block has a shape of hexagon.

In some examples, as illustrated by FIG. 4A, within the same one of the plurality of minimum repeating regions 100, a distance between a center of the first color sub-pixel block 111 of the third virtual rectangle 130 and a center of the first color sub-pixel block 111 of the fourth virtual rectangle 140 is 0.2-0.9 times of the length of the first edge; within two adjacent ones of the plurality of minimum repeating regions 100 in the second direction, the two adjacent ones of the plurality of minimum repeating regions include a first minimum repeating region and a second minimum repeating region sequentially arranged in the second direction; and a distance between a center of the first color sub-pixel block 111 of the first virtual rectangle 110 of the first minimum repeating region and a center of the first color sub-pixel block 111 of the second virtual rectangle 120 of the second minimum repeating region is 0.2-0.9 times of the length of the first edge. Thus, the distance between two first color sub-pixel blocks in two adjacent rows is relatively large, so as to reduce the sawtooth feeling of green horizontal line and grain feeling of vertical line, thus improving the display effect.

In some examples, as illustrated by FIG. 4A, within the same one of the plurality of minimum repeating regions, a distance between a center of the first color sub-pixel block of the third virtual rectangle and a center of the first color sub-pixel block of the fourth virtual rectangle is 0.5-0.7 times, for example, 0.59 times, of the length of the first edge; within two adjacent ones of the plurality of minimum repeating regions in the second direction, the two adjacent ones of the plurality of minimum repeating regions include a first minimum repeating region and a second minimum repeating region sequentially arranged in the second direction; and a distance between a center of the first color sub-pixel block of the first virtual rectangle of the first minimum repeating region and a center of the first color sub-pixel block of the second virtual rectangle of the second minimum repeating region is 0.5-0.7 times, for example, 0.59 times, of the length of the first edge. Thus, the distance between two first color sub-pixel blocks in two adjacent rows is relatively large, so as to further reduce the sawtooth feeling of green horizontal line and grain feeling of vertical line, thus improving the display effect.

For example, as illustrated by FIG. 4A, within the same one of the plurality of minimum repeating regions 100, a distance between a center of the first color sub-pixel block 111 of the first virtual rectangle 110 and a center of the first color sub-pixel block 111 of the second virtual rectangle 120 is 1.1-1.8 times of the length of the first edge; within two adjacent ones of the plurality of minimum repeating regions 100 in the second direction, the two adjacent ones of the plurality of minimum repeating regions include a first minimum repeating region and a second minimum repeating region sequentially arranged in the second direction; and a distance between a center of the first color sub-pixel block 111 of the third virtual rectangle 130 of the first minimum repeating region and a center of the first color sub-pixel block 111 of the fourth virtual rectangle 140 of the second minimum repeating region is 1.1-1.8 times of the length of the first edge. Thus, the distance between two first color sub-pixel blocks in the same row is relatively small, so as to reduce the sawtooth feeling of green horizontal line and grain feeling of vertical line, thus improving the display effect.

For example, as illustrated by FIG. 4A, within the same one of the plurality of minimum repeating regions, a distance between a center of the first color sub-pixel block of the first virtual rectangle and a center of the first color sub-pixel block of the second virtual rectangle is 1.3-1.5 times, for example, 1.4 times, of the length of the first edge; within two adjacent ones of the plurality of minimum repeating regions in the second direction, the two adjacent ones of the plurality of minimum repeating regions include a first minimum repeating region and a second minimum repeating region sequentially arranged in the second direction; and a distance between a center of the first color sub-pixel block of the third virtual rectangle of the first minimum repeating region and a center of the first color sub-pixel block of the fourth virtual rectangle of the second minimum repeating region is 1.3-1.5 times, for example, 1.4 times, of the length of the first edge. Thus, the distance between two first color sub-pixel blocks in the same row is relatively small, so as to reduce the sawtooth feeling of green horizontal line and grain feeling of vertical line, thus improving the display effect.

For example, in some examples, as illustrated by FIG. 4A, an organic light-emitting layer of the first color sub-pixel block 111 of the third virtual rectangle 130 and an organic light-emitting layer of the first color sub-pixel block 111 of the fourth virtual rectangle 140 are evaporated through a same opening on a fine metal mask.

For example, in some examples, as illustrated by FIG. 4A, within the two minimum repeating regions 100 adjacent to each other in the second direction, the adjacent two minimum repeating regions 100 in the second direction include the first minimum repeating region 1001 and the second minimum repeating region 1002 sequentially arranged in the second direction; and a first color sub-pixel block 111 of the first virtual rectangle 110 of the first minimum repeating region 1001 and a first color sub-pixel block 111 of the second virtual rectangle 120 of the second minimum repeating region 1002 may share a same single color pattern region in a sub-pixel patterning process. For example, when the pixel arrangement structure is applied to an organic light-emitting display device, the sub-pixel patterning process includes an evaporation process; and a light-emitting layer of the first color sub-pixel block 111 of the first virtual rectangle 110 of the first minimum repeating region 1001 and a light-emitting layer of the first color sub-pixel block 111 of the second virtual rectangle 120 of the second minimum repeating region 1002 may be formed through a same opening on the mask, that is to say, the first color sub-pixel block 111 of the first virtual rectangle 110 of the first minimum repeating region 1001 and the first color sub-pixel block 111 of the second virtual rectangle 120 of the second minimum repeating region 1002 include the light-emitting layers formed through the same opening on the mask. Of course, the above-described sub-pixel patterning process includes, but is not limited to, an evaporation process, and may also include printing, a color filter patterning process, and so on. Thus, the first color sub-pixel block 111 of the first virtual rectangle 110 of the first minimum repeating region 1001 and the first color sub-pixel block 111 of the second virtual rectangle 120 of the second minimum repeating region 1002 share a same single color pattern region in a sub-pixel patterning process such as printing and a color filter patterning process. Therefore, combination of first color sub-pixel blocks into a same sub-pixel can reduce a process difficulty in fabricating the first color sub-pixel block.

For example, in some examples, as illustrated by FIG. 4A, within the same minimum repeating region 100, a distance between a center of the second color sub-pixel block 112 and a center of the third color sub-pixel block 113 in the first virtual rectangle 110 ranges from 5/9 to 7/9 of the length of the first edge, so that it can be ensured that a distance from the third color sub-pixel blocks 113 of the first virtual rectangle 110 and the second virtual rectangle 120 to second color sub-pixel blocks 112 of a first virtual rectangle 110 and a second virtual rectangle 120 of an adjacent minimum repeating region in the first direction is sufficiently large, so that it is convenient to form the first color sub-pixel block 111 of the third virtual rectangle 130 and the first color sub-pixel block 111 of the fourth virtual rectangle 140 within the same minimum repeating region 100 through a same opening on the mask, and to form the first color sub-pixel block 111 of the first virtual rectangle 110 of the first minimum repeating region 1001 and the first color sub-pixel block 111 of the second virtual rectangle 120 of the second minimum repeating region 1002 through a same opening on the mask, so as to reduce a difficulty in process.

In addition, as viewed from a relationship between respective virtual rectangles and the minimum repeating region of FIG. 4A, a step of the minimum repeating region in the first direction is approximately equal to edge lengths of two virtual rectangles, that is, the step of the minimum repeating region in the first direction is about 2L. As illustrated by FIG. 4A, the second color sub-pixel block and the third color sub-pixel block in the first virtual rectangle 110 and the second color sub-pixel block and the third color sub-pixel block in the second virtual rectangle 120 may be combined into one second color sub-pixel block and one third color sub-pixel block, which, plus one first color sub-pixel block in the third virtual rectangle 130 and one first color sub-pixel block in the fourth virtual rectangle 130, may form a repeating unit. That is to say, a size of the repeating unit in the first direction or a step of the repeating unit in the first direction is twice the length of the edge of the virtual rectangle in the first direction. If the virtual rectangle is a square, then the step of the minimum repeating unit in the first direction is approximately 2L.

As can be seen from FIG. 4A, the second color sub-pixel block and the third color sub-pixel block have elongated shapes, that is, elongated shapes extending in the second direction. In addition, the second color sub-pixel block and the third color sub-pixel block may also have elliptical shapes. With respect to the second color sub-pixel block, if it is divided into two portions (the two portions are, for example, the second color sub-pixel block located in the first virtual rectangle 110 and the second color sub-pixel block located in the second virtual rectangle) by a center line along the first direction, then a distance between centers of the two second color sub-pixel blocks is less than 0.3L. In addition, a size of the second color sub-pixel block in the second direction is less than 0.6L.

With respect to the second color sub-pixel block and the third color sub-pixel block, a ratio of a size in the second direction to a size in the first direction is $\gamma$, and $\gamma>1$. That is to say, the second color sub-pixel block and the third color sub-pixel block have elongated shapes extending in the second direction.

For example, the second color sub-pixel is a red sub-pixel, and the third color sub-pixel is a blue sub-pixel. A lifetime of the red sub-pixel is usually longer than that of the blue sub-pixel. Therefore, an area of the red sub-pixel may be smaller than an area of the blue sub-pixel; however, a ratio of a size in the first direction to a size in the second direction of the red sub-pixel cannot be too small; if it is too small, a marked difference between a lateral direction and a longitudinal direction may be affected.

Figure 4F:
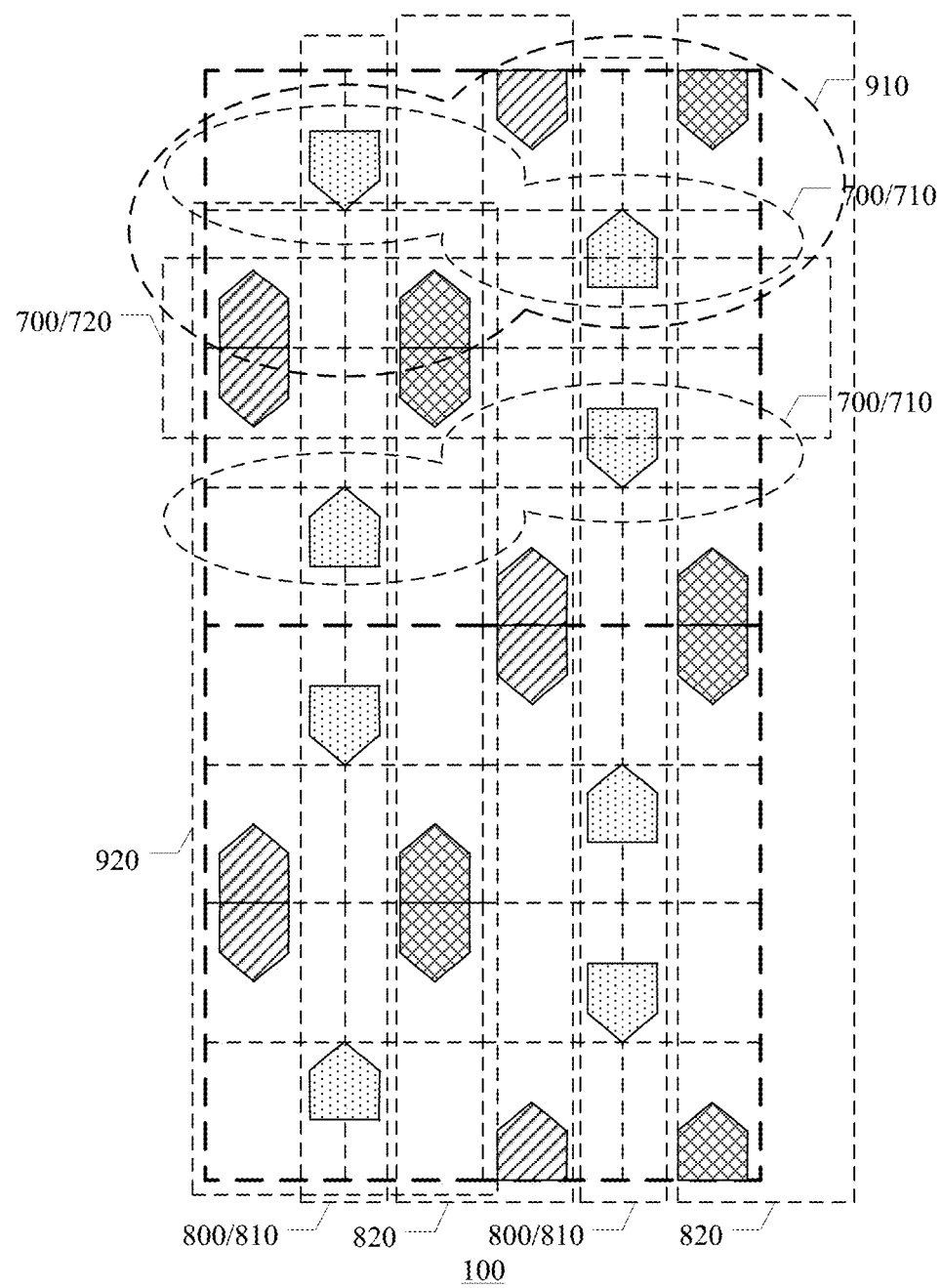
FIG. 4F is a schematic diagram of another pixel arrangement structure provided by an embodiment of the present disclosure.
Figure 4G:
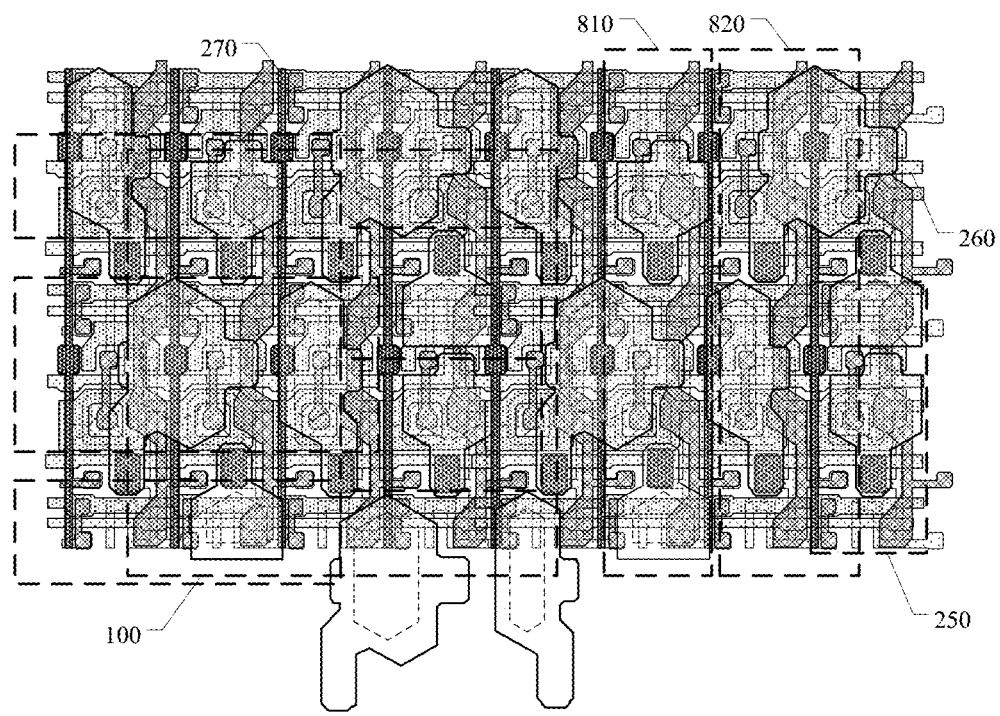
FIG. 4G is a schematic diagram of another pixel arrangement structure provided by an embodiment of the present disclosure.

For example, as illustrated by FIG. 4F and FIG. 4G, the first color sub-pixel blocks 111 in virtual rectangles belonging to the same row are located in a first sub-pixel row 710, each of the plurality of minimum repeating regions 100 includes two first sub-pixel rows 710, and a second sub-pixel row 720 is provided between the two first sub-pixel rows 710, the second sub-pixel row 720 includes multiple second color sub-pixel blocks 112 and multiple third color sub-pixel blocks 113 alternately arranged in the first direction, and multiple first sub-pixel rows 710 and multiple second sub-pixel rows 720 are alternately arranged in the second direction; the first color sub-pixel blocks 111 in the first sub-pixel row 710 are controlled by the same row of pixel circuits 250 (for example, the anodes used for driving the first color sub-pixel blocks 111 in the first sub-pixel row 710 are electrically connected the pixel circuits 250 of the same row), so as to be controlled by one gate line 260, and the second color sub-pixel blocks 112 and the third color sub-pixel blocks 113 in the second sub-pixel row 720 are also controlled by the same row of pixel circuits 250 (for example, the anodes used for driving the second color sub-pixel blocks 112 and the third color sub-pixel blocks 113 in the second sub-pixel row 720 are electrically connected the pixel circuits 250 of the same row), so as to be controlled by one gate line 260.

For example, as illustrated by FIG. 4G, the first color sub-pixel blocks 111 in the first sub-pixel row 710 and the second color sub-pixel blocks 112 and the third color sub-pixel blocks 113 in the second sub-pixel row 720 which is adjacent to the first sub-pixel row 710 may be controlled by the same row of pixel circuits 250. So that, in the present disclosure, four sub-pixel rows 700 (including two first sub-pixel rows 710 and two second sub-pixel rows 720) can be controlled by two rows of pixel circuits.

For example, as illustrated by FIGS. 4F and 4G, the first color sub-pixel blocks 111 in virtual rectangles belonging to the same column are located in a first sub-pixel column 810, each of the plurality of minimum repeating regions 100 includes two first sub-pixel columns 810, and a second sub-pixel column 820 is provided between the two first sub-pixel columns 810, the second sub-pixel column 820 includes multiple second color sub-pixel blocks 112 and multiple third color sub-pixel blocks 113 alternately arranged in the second direction, and multiple first sub-pixel columns 810 and multiple second sub-pixel columns 820 are alternately arranged in the first direction. The first color sub-pixel blocks 111 in the first sub-pixel column are controlled by the same column of pixel circuits 250 (for example, the anodes used for driving the first color sub-pixel blocks 111 in the first sub-pixel column 810 are electrically connected the pixel circuits 250 of the same column), so as to be driven by one data line 270, and the second color sub-pixel blocks 112 and the third color sub-pixel blocks 113 in the second sub-pixel column 820 are also controlled by the same column of pixel circuits 250 (for example, the anodes used for driving the second color sub-pixel blocks 112 and the third color sub-pixel blocks 113 in the second sub-pixel column 820 are electrically connected the pixel circuits 250 of the same column), so as to be controlled by one data line 270.

For example, as illustrated by FIG. 4F, each of the plurality of minimum repeating regions 100 averagely includes four sub-pixel rows 700 (including two first sub-pixel row 710 and two second sub-pixel row 720) and four sub-pixel columns 800 (including two first sub-pixel column 810 and two second sub-pixel column 820), and the four sub-pixel rows 700 and four sub-pixel columns 800 constitute two pixel rows 910 and two pixel columns 920. In this way, a ratio of the number of the sub-pixel rows to the number of the pixel rows in the second direction is substantially the same as a ratio of the number of the sub-pixel columns to the number of the pixel columns in the first direction.

It is to be noted that, in the first direction, the number of the sub-pixels averagely distributed each pixel is ⅔ of the number of RGB sub-pixels needed by the pixel to achieve full-color display. Besides, in the second direction, the number of the sub-pixels averagely distributed each pixel is ⅔ of the number of RGB sub-pixels needed by the pixel to achieve full-color display.

Figure 5:
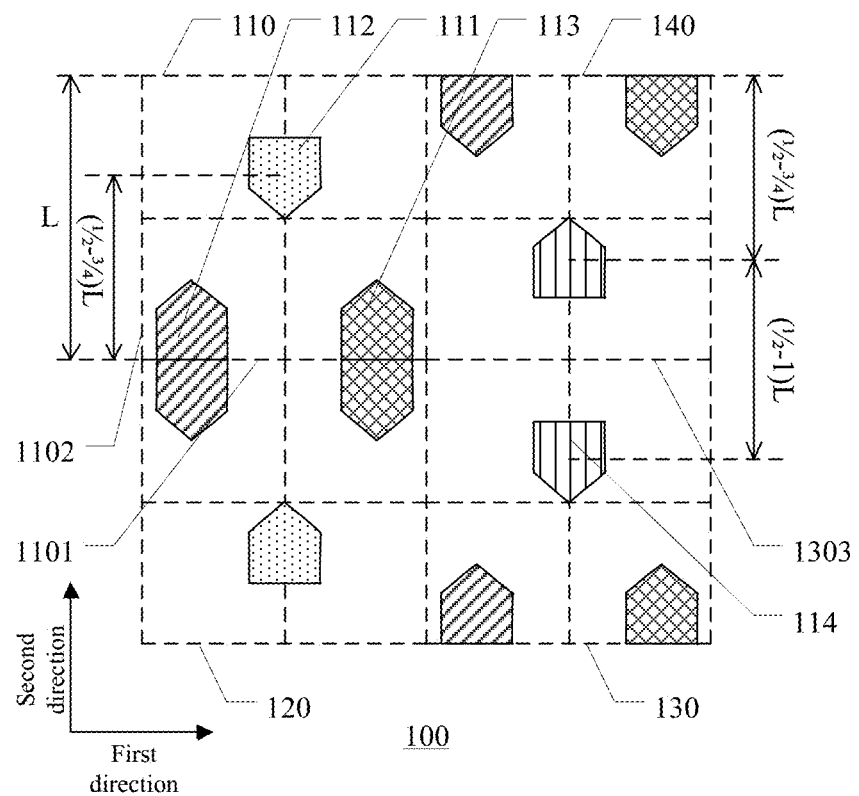
FIG. 5 is a schematic diagram of another pixel arrangement structure provided by an embodiment of the present disclosure.

FIG. 5 is a pixel arrangement structure provided by an embodiment of the present disclosure. As illustrated by FIG. 5, first color sub-pixel blocks 111 in a third virtual rectangle 130 and a fourth virtual rectangle 140 are replaced with fourth color sub-pixel blocks 114.

For example, the first color sub-pixel block 111 includes a green sub-pixel, and the fourth color sub-pixel block 114 includes a yellow sub-pixel. Therefore, a four-color mode of red, green, blue and yellow (RGBY) may be used in the pixel arrangement structure, so as to further improve display quality of the pixel arrangement structure.

Figure 6:
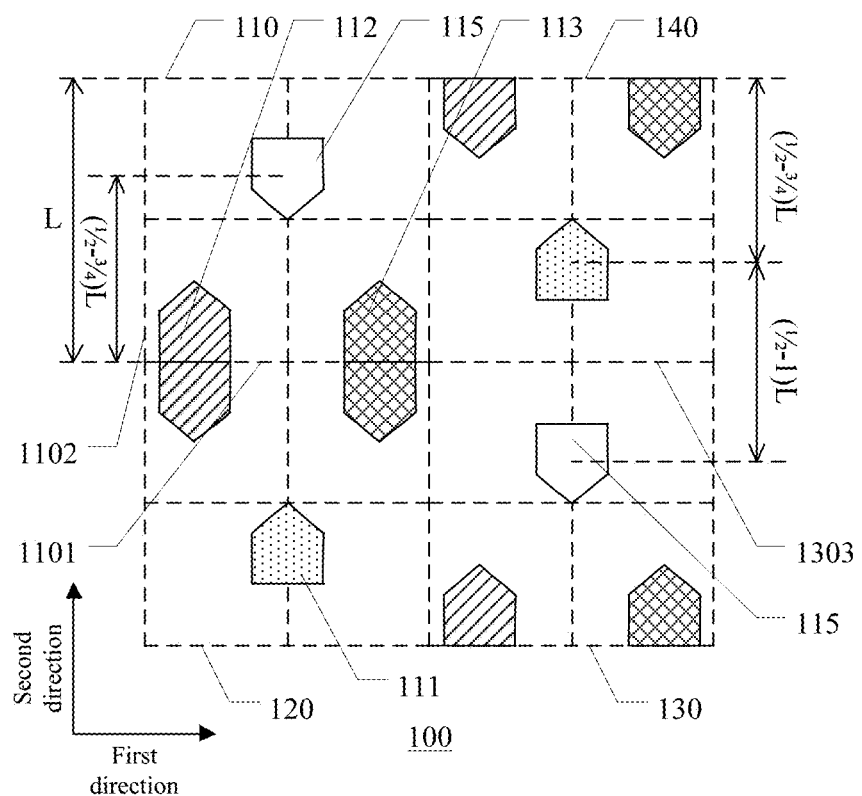
FIG. 6 is a schematic diagram of another pixel arrangement structure provided by an embodiment of the present disclosure.

FIG. 6 is a pixel arrangement structure provided by an embodiment of the present disclosure. As illustrated by FIG. 6, first color sub-pixel blocks 111 in a first virtual rectangle 110 and a third virtual rectangle 130 are replaced with fifth color sub-pixel blocks 115.

For example, the first color sub-pixel block 110 includes a green sub-pixel, and the fifth color sub-pixel block 115 includes a white sub-pixel. Therefore, a red, green, blue and white (RGBW) mode may be used in the pixel arrangement structure, so as to effectively improve brightness of the pixel arrangement structure and improve utilization efficiency of energy.

Figure 7:
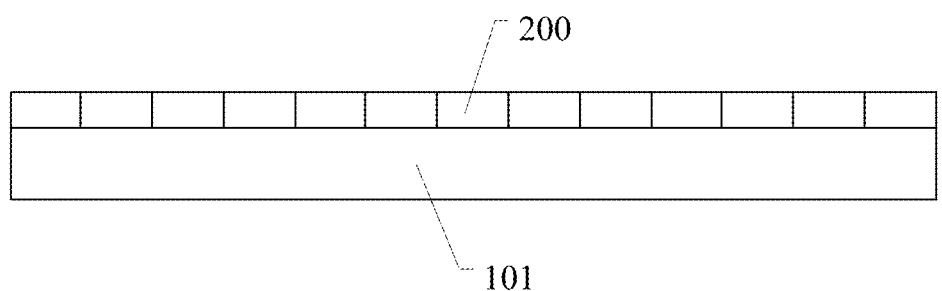
FIG. 7 is a structural schematic diagram of a display substrate provided by an embodiment of the present disclosure.

An embodiment of the present disclosure further provides a display substrate. FIG. 7 is the display substrate provided by the embodiment of the present disclosure. As illustrated by FIG. 7, the display substrate includes a base substrate 101 and a plurality of pixels 200 arranged on the base substrate 101. The plurality of pixels 200 may adopt the pixel arrangement structure provided by any one of the above-described examples. Because the display substrate may adopt the pixel arrangement structure provided by any one of the above-described examples, the display substrate has advantageous effects of the pixel arrangement structure included therein, for example, the display substrate can improve uniformity of distribution of first color sub-pixel blocks, so as to improve visual resolution and also improve display quality.

Figure 8:
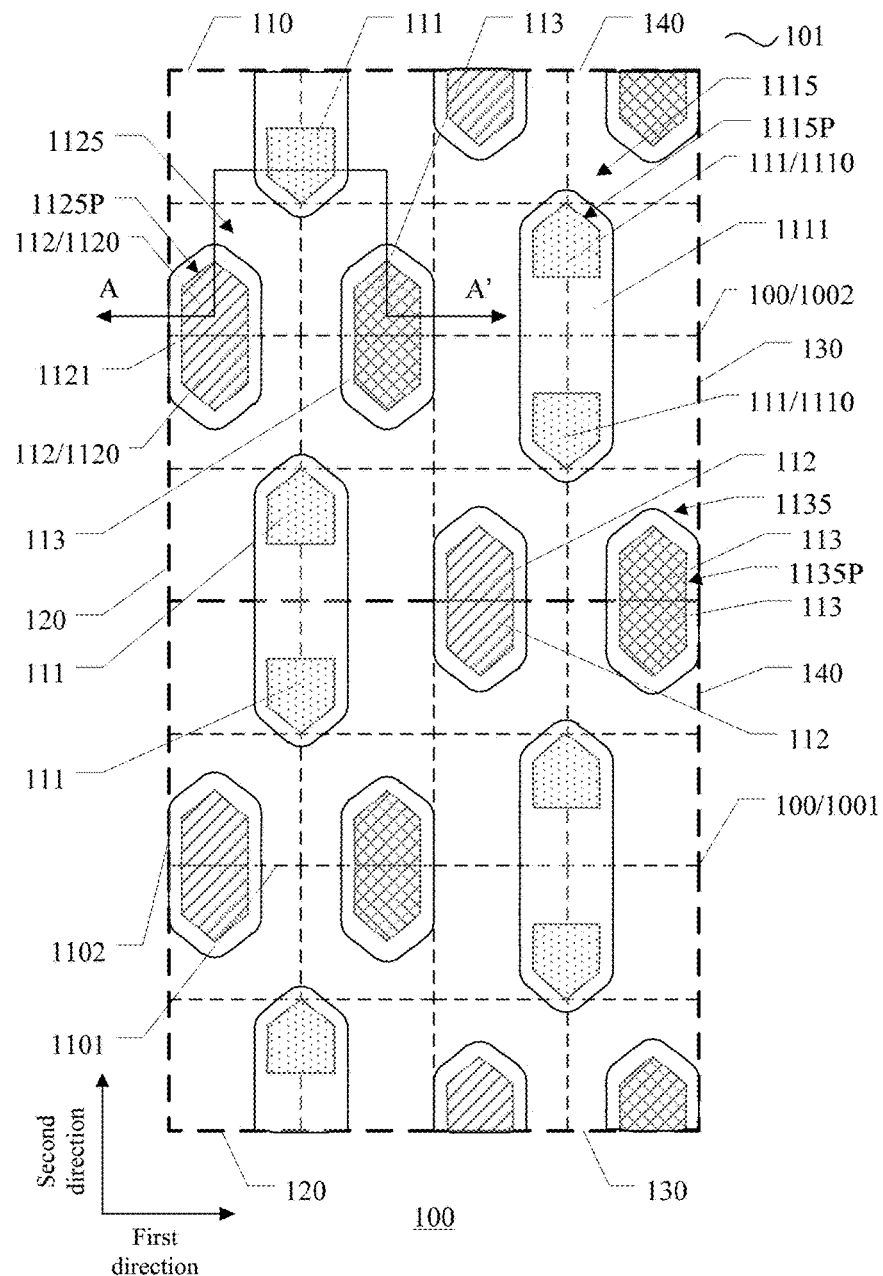
FIG. 8 is a partial schematic plan view of a display substrate provided by an embodiment of the present disclosure.
Figure 9:
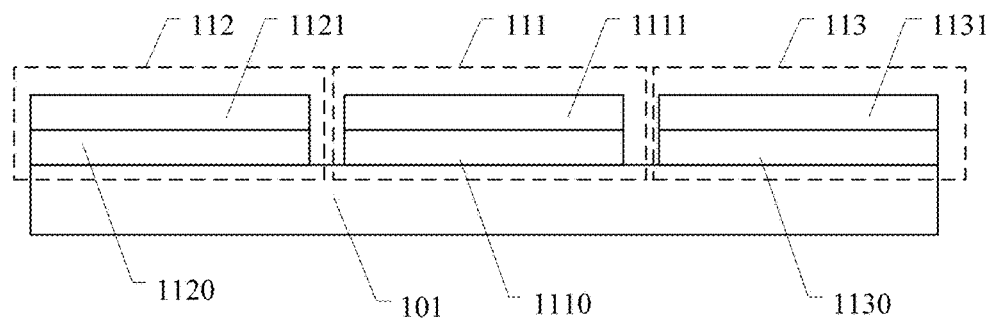
FIG. 9 is a cross-sectional schematic diagram of the display substrate taken along direction A-A' in FIG. 8 provided by the embodiment of the present disclosure.

FIG. 8 is a partial schematic plan view of another display substrate provided by an embodiment of the present disclosure. FIG. 9 is a cross-sectional schematic diagram of the display substrate taken along direction A-A' in FIG. 8 provided by the embodiment of the present disclosure. As illustrated by FIG. 8, a first color sub-pixel block 111 includes a first color pixel electrode 1110 and a first color light-emitting layer 1111 provided on the first color pixel electrode 1110, a second color sub-pixel block 112 includes a second color pixel electrode 1120 and a second color light-emitting layer 1121 provided on the second color pixel electrode 1120, and a third color sub-pixel block 113 includes a third color pixel electrode 1130 and a third color light-emitting layer 1131 provided on the third color pixel electrode 1130. Thus, the display substrate may be an array substrate.

It is to be noted that, a first pixel defining layer 1115 may be disposed between the first color pixel electrode 1110 and the first color light-emitting layer 1111, and the first pixel defining layer 1115 includes a first opening 1115P exposing a portion of the first color pixel electrode 1110; the first color light-emitting layer 1111 provided on the first pixel defining layer 1115 contacts the portion of the first color pixel electrode 1110 as exposed by the first opening 1115P; the first color pixel electrode 1110 and the first color light-emitting layer 1111 defined by the first opening 1115P is the first color sub-pixel block 111.

It is to be noted that, a second pixel defining layer 1125 may be disposed between the second color pixel electrode 1110 and the second color light-emitting layer 1121, and the second pixel defining layer 1125 includes a second opening 1125P exposing a portion of the second color pixel electrode 1120; the second color light-emitting layer 1121 provided on the second pixel defining layer 1125 contacts the portion of the second color pixel electrode 1120 as exposed by the second opening 1125P; the second color pixel electrode 1120 the second color light-emitting layer 1121 defined by the second opening 1125P is the second color sub-pixel block 112.

It is to be noted that, a third pixel defining layer 1135 may be disposed between the third color pixel electrode 1130 and the third color light-emitting layer 1131, and the third pixel defining layer 1135 includes a third opening 1135P exposing a portion of the third color pixel electrode 1130; the third color light-emitting layer 1131 provided on the third pixel defining layer 1135 contacts the portion of the third color pixel electrode 1130 as exposed by the third opening 1115P; the third color pixel electrode 1140 and the third color light-emitting layer 1131 defined by the third opening 1135P is the third color sub-pixel block 111.

For example, two adjacent ones of the plurality of second color sub-pixel blocks 112 are integrated into a second unitary sub-pixel block 1128, and two adjacent ones of the plurality of third color sub-pixel blocks 113 are integrated into a third unitary sub-pixel block 1138; a shape and a size of the second unitary sub-pixel block 1128 is defined by the same second opening 1125P, and a shape and a size of the third unitary sub-pixel block 1138 is defined by the third opening 1135P. Two second color pixel electrodes 1120 of the two adjacent ones of the plurality of second color sub-pixel blocks 112 integrated into the second unitary sub-pixel block 1128 are integrated as one second unitary pixel electrode 1120, two third color pixel electrodes 1130 of the two adjacent ones of the plurality of third color sub-pixel blocks 1130 integrated into the third unitary sub-pixel block 1138 are as one third unitary pixel electrode 1130.

For example, the plurality of block groups G100 includes a third block group G130 and a fourth block group G140, in each of the plurality of repeating regions 100, the second base edge 112E of the second color sub-pixel block 112 and the third base edge 113E of the third color sub-pixel block 113 in the third block group G130 are located on the second virtual line 302, the second base edge 112E of the second color sub-pixel block 112 and the third base edge 113E of the third color sub-pixel block 113 in the fourth block group G140 are located on a third virtual line 303, the third virtual line 303 is located at a side of the second virtual line 302 away from the first virtual line 301, the first color sub-pixel block 111 in the third block group G130 and the first color sub-pixel block 111 in the fourth block group G140 are located between the second virtual line 302 and the third virtual line 303, the first protrusion 111P of the first color sub-pixel block 111 in the third block group G130 is protruded toward the second virtual line 302, the first protrusion 111P of the first color sub-pixel block 111 in the fourth block group G140 is protruded toward the third virtual line 303, the first color light-emitting layer 1111 in the second block group G120 and the first color light-emitting layer 1111 in the fourth block group G140 are integrated as one first color light-emitting layer 1111, and the first color pixel electrode 1110 of the first color sub-pixel block 111 in the third block group G130 and the first color pixel electrode 1110 of the first color-pixel block 111 in the fourth block group G140 are two independent first color pixel electrodes 1110.

For example, in some examples, the first color pixel electrode 1110 is configured to drive the first color light-emitting layer 1111 to emit light.

For example, a shape of the first color pixel electrode 1110 may be the same as a shape of the first color sub-pixel block 111. Of course, the embodiment of the present disclosure includes, but is not limited thereto, the shape of the first color pixel electrode 1110 may be different from the shape of the first color sub-pixel block 111, and the shape of the first color sub-pixel block 111 may be defined by a pixel defining layer.

It should be noted that, the shape of the above-described first color sub-pixel block is a shape of a light-emitting region of the first color sub-pixel block. In addition, a specific shape of the first color light-emitting layer may be set according to a preparation process, which will not be limited here in the embodiment of the present disclosure. For example, the shape of the first color light-emitting layer may be determined by a shape of an opening of a mask in the preparation process.

For example, the first color pixel electrode 1110 may be in contact with the first color light-emitting layer 1111, so that it can drive the light-emitting layer to emit light at a portion in contact with each other, and the portion where the first color pixel electrode 1110 and the first color light-emitting layer 1111 can be in contact with each other is an effective portion that a sub-pixel can emit light. Therefore, the shape of the above-described first color sub-pixel block is the shape of the light-emitting region of the first color sub-pixel block. In the embodiment of the present disclosure, the first color pixel electrode 1110 may be an anode, but is not limited to an anode, and a cathode of a light emitting diode may also be used as the pixel electrode.

For example, in some examples, the second color pixel electrode 1120 is configured to drive the second color light-emitting layer 1121 to emit light.

For example, a shape of the second color pixel electrode 1120 may be the same as a shape of the second color sub-pixel block 112. Of course, the embodiment of the present disclosure includes, but is not limited thereto, the shape of the second color pixel electrode 1120 may be different from the shape of the second color sub-pixel block 112, and the shape of the second color sub-pixel block 112 may be defined by a pixel defining layer.

It should be noted that, the shape of the above-described second color sub-pixel block is a shape of a light-emitting region of the second color sub-pixel block. In addition, a specific shape of the second color light-emitting layer may be set according to a preparation process, which will not be limited here in the embodiment of the present disclosure. For example, the shape of the second color light-emitting layer may be determined by a shape of an opening of a mask in the preparation process.

For example, the second color pixel electrode 1120 may be in contact with the second color light-emitting layer 1121, so that it can drive the light-emitting layer to emit light at a portion in contact with each other, and the portion where the second color pixel electrode 1120 and the second color light-emitting layer 1121 can be in contact with each other is an effective portion that a sub-pixel can emit light. Therefore, the shape of the above-described second color sub-pixel block is the shape of the light-emitting region of the second color sub-pixel block. In the embodiment of the present disclosure, the second color pixel electrode 1120 may be an anode, but is not limited to an anode, and a cathode of a light emitting diode may also be used as the pixel electrode.

For example, in some examples, the third color pixel electrode 1130 is configured to drive the third color light-emitting layer 1131 to emit light.

For example, a shape of the third color pixel electrode 1130 may be the same as a shape of the third color sub-pixel block 113. Of course, the embodiment of the present disclosure includes, but is not limited thereto, the shape of the third color pixel electrode 1130 may be different from the shape of the third color sub-pixel block 113, and the shape of the third color sub-pixel block 113 may be defined by a pixel defining layer.

It should be noted that, the shape of the above-described third color sub-pixel block is a shape of a light-emitting region of the third color sub-pixel block. In addition, a specific shape of the third color light-emitting layer may be set according to a preparation process, which will not be limited here in the embodiment of the present disclosure. For example, the shape of the third color light-emitting layer may be determined by a shape of an opening of a mask in the preparation process.

For example, the third color pixel electrode 1130 may be in contact with the third color light-emitting layer 1131, so that it can drive the light-emitting layer to emit light at a portion in contact with each other, and the portion where the third color pixel electrode 1130 and the third color light-emitting layer 1131 can be in contact with each other is an effective portion that a sub-pixel can emit light. Therefore, the shape of the above-described third color sub-pixel block is the shape of the light-emitting region of the third color sub-pixel block. In the embodiment of the present disclosure, the third color pixel electrode 1130 may be an anode, but is not limited to an anode, and a cathode of a light emitting diode may also be used as the pixel electrode.

It should be noted that, with respect to each sub-pixel, an area of a pixel electrode may be slightly larger than an area of a light-emitting layer, or the area of the light-emitting layer may also be slightly larger than the area of the pixel electrode, which will not be particularly limited in the embodiment of the present disclosure. For example, the light-emitting layer here may include an electroluminescent layer itself as well as other functional layers located on both sides of the electroluminescent layer, for example, a hole injection layer, a hole transport layer, an electron injection layer, an electron transport layer, and so on. In some embodiments, a shape of a sub-pixel may also be defined by a pixel defining layer. For example, a lower electrode (e.g., an anode) of a light emitting diode may be provided below the pixel defining layer; the pixel defining layer includes an opening for defining the sub-pixel; the opening exposes a portion of the lower electrode; and when a light-emitting layer is formed in the opening in the above-described pixel defining layer, the light-emitting layer is in contact with the lower electrode, which can drive the light-emitting layer to emit light at the portion. Therefore, in this case, the opening of the pixel defining layer defines the shape of the sub-pixel.

For example, the shapes of the various sub-pixels as described in the embodiment of the present disclosure are all approximate shapes; and when the light-emitting layer or various electrode layers are formed, it cannot be ensured that an edge of a sub-pixel is a strict straight line and a corner thereof is a strict angle. For example, the light-emitting layer may be formed by using an evaporation process with a mask, and thus, its corner portion may have a rounded shape. In some cases, a draft angle is needed in a metal etching process, so when a light-emitting layer of a sub-pixel is formed by using an evaporation process, a corner of the light-emitting layer may be removed.

For example, in some examples, as illustrated by FIG. 8 and FIG. 9, within a same minimum repeating region 100, a first color light-emitting layer 1111 of a first color sub-pixel block 111 of a third virtual rectangle 130 and a first color light-emitting layer 1111 of a first color sub-pixel block 111 of a fourth virtual rectangle 140 may be formed by sharing a same single color pattern region, for example, formed through a same opening of a mask.

For example, in some examples, an area of the first color light-emitting layer 1111 of the first color sub-pixel block 111 of the third virtual rectangle 130 and the first color light-emitting layer 1111 of the first color sub-pixel block 111 of the fourth virtual rectangle 140 formed by sharing a same single color pattern region is larger than a sum of an area of a first color pixel electrode 1110 of the first color sub-pixel block 111 of the third virtual rectangle 130 and an area of a first color pixel electrode 1110 of the first color sub-pixel block 111 of the fourth virtual rectangle 140.

For example, in some examples, because a distance between a center of the first color sub-pixel block 111 of the third virtual rectangle 130 and a center of the first color sub-pixel block 111 of the fourth virtual rectangle 140 is larger than ½ of a length of a second edge 1102, the area of the first color light-emitting layer 1111 of the first color sub-pixel block 111 of the third virtual rectangle 130 and the first color light-emitting layer 1111 of the first color sub-pixel block 111 of the fourth virtual rectangle 140 formed by sharing a same single color pattern region is larger than 1.5 times the sum of the area of the first color pixel electrode 1110 of the first color sub-pixel block 111 of the third virtual rectangle 130 and the area of the first color pixel electrode 1110 of the first color sub-pixel block 111 of the fourth virtual rectangle 140.

For example, in some examples, as illustrated by FIG. 8 and FIG. 9, within two minimum repeating regions 100 adjacent to each other in a second direction, the adjacent two minimum repeating regions 100 in the second direction include a first minimum repeating region 1001 and a second minimum repeating region 1002 sequentially arranged in the second direction; and a first color light-emitting layer 1111 of a first color sub-pixel block 111 of a first virtual rectangle 110 within the first minimum repeating region 1001 and a first color light-emitting layer 1111 of a first color sub-pixel block 111 of a second virtual rectangle 120 within the second minimum repeating region 1002 may be formed by sharing a same single color pattern region, for example, formed through a same opening of the mask.

For example, in some examples, an area of the first color light-emitting layer 1111 of the first color sub-pixel block 111 of the first virtual rectangle 110 within the first minimum repeating region 1001 and the first color light-emitting layer 1111 of the first color sub-pixel block 111 of the second virtual rectangle 120 within the second minimum repeating region 1002 formed by sharing a same single color pattern region is larger than a sum of an area of a first color pixel electrode 1110 of the first color sub-pixel block 111 of the first virtual rectangle 110 within the first minimum repeating region 1001 and an area of a first color pixel electrode 1110 of the first color sub-pixel block 111 of the second virtual rectangle 120 within the second minimum repeating region 1002.

For example, because a distance between a center of the first color sub-pixel block 111 of the first virtual rectangle 110 within the first minimum repeating region 1001 and a center of the first color sub-pixel block 111 of the second virtual rectangle 120 within the second minimum repeating region 1002 is larger than ½ of the length of the second edge 1102, the area of the first color light-emitting layer 1111 of the first color sub-pixel block 111 of the first virtual rectangle 110 within the first minimum repeating region 1001 and the first color light-emitting layer 1111 of the first color sub-pixel block 111 of the second virtual rectangle 120 within the second minimum repeating region 1002 formed by sharing a same single color pattern region is larger than 1.5 times the sum of the area of the first color pixel electrode 1110 of the first color sub-pixel block 111 of the first virtual rectangle 110 within the first minimum repeating region 1001 and the area of the first color pixel electrode 1110 of the first color sub-pixel block 111 of the second virtual rectangle 120 within the second minimum repeating region 1002.

For example, in some examples, a first color sub-pixel block 111, a second color sub-pixel block 112 and a third color sub-pixel block 113 may separately serve as one sub-pixel for display; and a first color sub-pixel block 111, a second color sub-pixel block 112 and a third color sub-pixel block 113 in each virtual rectangle may constitute a pixel unit for color display. Of course, the embodiment of the present disclosure includes, but is not limited thereto, and the first color sub-pixel block 111, the second color sub-pixel block 112 and the third color sub-pixel block 113 may be respectively combined with an adjacent same color sub-pixel block located in a different virtual rectangle into one sub-pixel, for example, at a shared edge of the adjacent virtual rectangle, for display. For example, a first edge 1101 passes through the combined sub-pixel, and the combined sub-pixel is symmetrical with respect to the first edge 1101. For example, in some examples, as illustrated by FIG. 8 and FIG. 9, within the same minimum repeating region 100, a second color pixel electrode 1120 of a second color sub-pixel block 112 of the first virtual rectangle 110 and a second color pixel electrode 1120 of a second color sub-pixel block 112 of the second virtual rectangle 120 are combined into a same pixel electrode, i.e., integrated into a unitary pixel electrode, so as to serve as one pixel electrode for loading a data signal to display a same grayscale. For example, in some examples, as illustrated by FIG. 8 and FIG. 9, within two minimum repeating regions 100 adjacent to each other in the second direction, the adjacent two minimum repeating regions 100 in the second direction include a first minimum repeating region 1001 and a second minimum repeating region 1002 sequentially arranged in the second direction; and a second color pixel electrode 1120 of a second color sub-pixel block 112 of a fourth virtual rectangle 140 within the first minimum repeating region 1001 and a second color pixel electrode 1120 of a second color sub-pixel block 112 of a third virtual rectangle 130 within the second minimum repeating region 1002 are combined into a same pixel electrode, i.e., integrated into a unitary pixel electrode, so as to serve as one pixel electrode for loading a data signal to display a same grayscale.

For example, in some examples, as illustrated by FIG. 8 and FIG. 9, within the same minimum repeating region 100, a third color pixel electrode 1130 of a third color sub-pixel block 113 of the first virtual rectangle 110 and a third color pixel electrode 1130 of a third color sub-pixel block 113 of the second virtual rectangle 120 are combined into a same pixel electrode, i.e., integrated into a unitary pixel electrode, so as to serve as one pixel electrode for loading a data signal to display a same grayscale.

For example, in some examples, as illustrated by FIG. 8 and FIG. 9, within two minimum repeating regions 100 adjacent to each other in the second direction, the adjacent two minimum repeating regions 100 in the second direction include a first minimum repeating region 1001 and a second minimum repeating region 1002 sequentially arranged in the second direction; and a third color pixel electrode 1130 of a third color sub-pixel block 113 of the fourth virtual rectangle 140 within the first minimum repeating region 1001 and a third color pixel electrode 1130 of a third color sub-pixel block 113 of the third virtual rectangle 130 within the second minimum repeating region 1002 are combined into a same pixel electrode, i.e., integrated into a unitary pixel electrode, so as to serve as one pixel electrode for loading a data signal to display a same grayscale.

Figure 10:
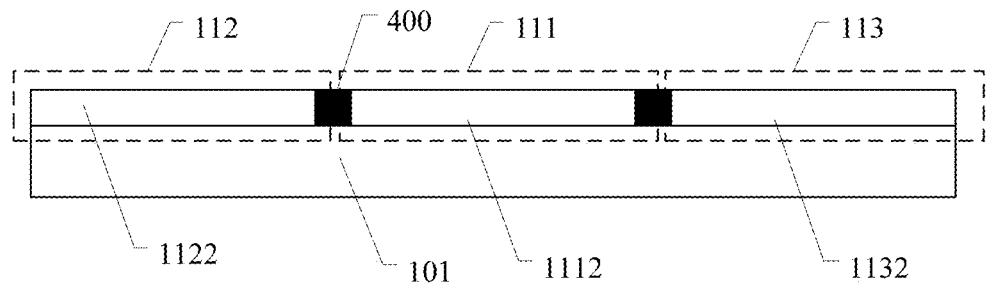
FIG. 10 is a cross-sectional schematic diagram of a display substrate taken along direction A-A' in FIG. 8 provided by an embodiment of the present disclosure.

FIG. 10 is a cross-sectional schematic diagram of another display substrate taken along direction A-A' in FIG. 8 provided by an embodiment of the present disclosure. As illustrated by FIG. 10, a first color sub-pixel block 111 includes a first color filter 1112, a second color sub-pixel block 112 includes a second color filter 1122, and a third color sub-pixel block 113 includes a third color filter 1132. Thus, the display substrate may be a color filter substrate. It should be noted that, when the display substrate is a color filter substrate, it is not only applicable to a liquid crystal display panel, but also applicable to a display panel in a mode combining a white light OLED with a color filter.

For example, in some examples, as illustrated by FIG. 10, the display substrate further includes a black matrix 400 provided among the first color filter 1112, the second color filter 1122 and the third color filter 1132.

An embodiment of the present disclosure further provides a display device. The display device includes any one of the display substrates provided by the above-described embodiments. Therefore, resolution of the display device may be improved, and a display device having true high resolution may be further provided. In addition, the pixel arrangement structure has better symmetry, so the display device has a better display effect.

For example, in some examples, the display device may be a smart phone, a tablet personal computer, a television, a monitor, a laptop, a digital photo frame, a navigator, and any other product or component having a display function.

An embodiment of the present disclosure further provides an electronic device. The electronic device includes any one of the array substrates provided by the above-described embodiments.

An embodiment of the present disclosure further provides a mask plate set. The mask plate set is configured to form the pixel arrangement structure provided by any one of the above-described examples.

For example, the mask plate set may include a first mask plate for forming a first color sub-pixel block, a second mask plate for forming a second color sub-pixel block, and a third mask plate for forming a third color sub-pixel block; that is to say, the mask plate is a mask for evaporation.

For example, the first mask plate may be provided thereon with a first opening, to form a light-emitting layer of a first color sub-pixel block in an evaporation process; the second mask plate may be provided thereon with a second opening, to form a light-emitting layer of a second color sub-pixel block in an evaporation process; and the third mask plate may be provided thereon with a third opening, to form a light-emitting layer of a third color sub-pixel block in an evaporation process.

Figure 11A:
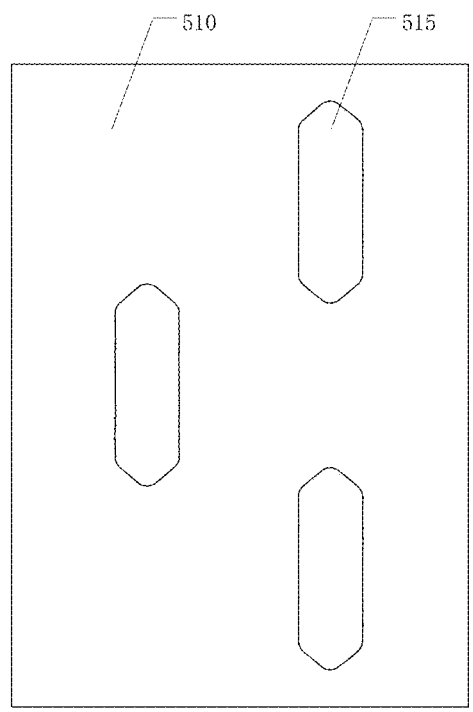
FIG. 11A is a schematic diagram of a first mask provided by an embodiment of the present disclosure.
Figure 11B:
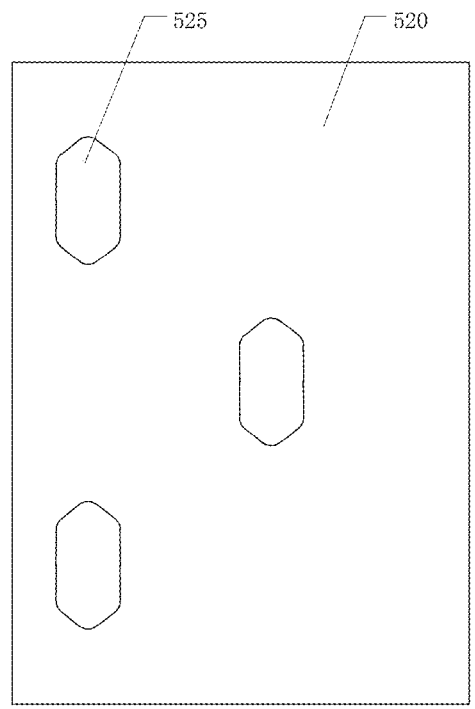
FIG. 11B is a schematic diagram of a second mask provided by the embodiment of the present disclosure.
Figure 11C:
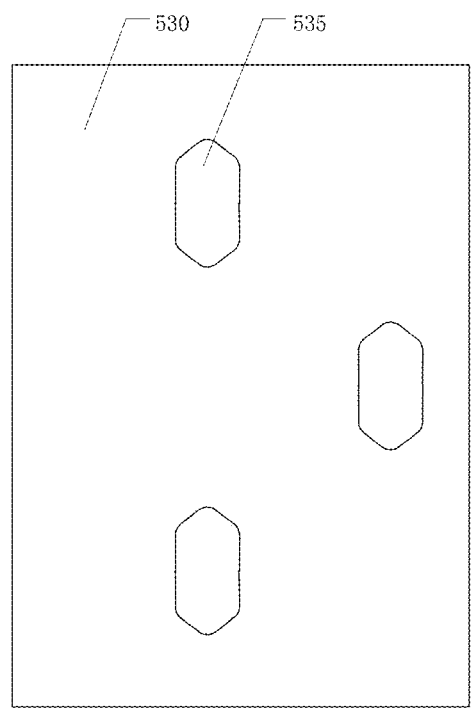
FIG. 11C is a schematic diagram of a third mask provided by the embodiment of the present disclosure.

FIG. 11A is a schematic diagram of the first mask plate provided by the embodiment of the present disclosure; FIG. 11B is a schematic diagram of the second mask plate provided by the embodiment of the present disclosure; and FIG. 11C is a schematic diagram of the third mask plate provided by the embodiment of the present disclosure. As illustrated by FIG. 11A to FIG. 11C, the mask plate set includes: a first mask plate 510, including a first opening 515, and configured to form a first color sub-pixel block; a second mask plate 520, including a second opening 525, and configured to form a second color sub-pixel block; and a third mask plate 530, including a third opening 535, and configured to form a third color sub-pixel block; wherein a first color light-emitting layer of a first color sub-pixel block of a third virtual rectangle and a first color light-emitting layer of a first color sub-pixel block of a fourth virtual rectangle are configured to be formed through the same first opening 515, which, thus, can reduce a fabrication difficulty and simplify a process.

For example, in some examples, a second color sub-pixel block of a first virtual rectangle and a second color sub-pixel block of a second virtual rectangle may be formed through the same second opening 525; and a third color sub-pixel of the first virtual rectangle and a third color sub-pixel block of the second virtual rectangle may also be formed through the same third opening 535.

The following statements should be noted:

(1) The drawings accompanying the embodiment(s) of the present disclosure involve only the structure(s) in connection with the embodiment(s) of the present disclosure, and other structure(s) can be referred to common design(s).

(2) In case of no conflict, features in an embodiment or in different embodiments of the present disclosure can be combined with each other.

The above are merely specific implementations of the present disclosure without limiting the protection scope of the present disclosure thereto. Within the technical scope revealed in the present disclosure, modification(s) or substitution(s) may be easily conceivable for those skilled who are familiar with the present technical field, and these modification(s) and substitution(s) all should be contained in the protection scope of the present disclosure. Therefore the protection scope of the present disclosure should be based on the protection scope of the appended claims.

What is claimed is:

1. An array substrate, comprising:
   a plurality of first color sub-pixel blocks, a plurality of second color sub-pixel blocks and a plurality of third color sub-pixel blocks distributed in a plurality of repeating regions,
   wherein each of the plurality of repeating regions comprises a plurality of block groups, each of the plurality of block groups comprises one first color sub-pixel block of the plurality of first color sub-pixel blocks, one second color sub-pixel block of the plurality of second color sub-pixel blocks, and one third color sub-pixel block of the plurality of third color sub-pixel blocks, the plurality of block groups comprises a first block group and a second block group,
   a shape of the first color sub-pixel block comprises a first protrusion and a first base edge opposite to the first protrusion, a shape of the second color sub-pixel block comprises a second protrusion and a second base edge opposite to the second protrusion, a shape of the third color sub-pixel block comprises a third protrusion and a third base edge opposite to the third protrusion,
   in each of the plurality of repeating regions, the second base edge of the second color sub-pixel block and the third base edge of the third color sub-pixel block in the second block group are located in a first virtual line, the second base edge of the second color sub-pixel block and the third base edge of the third color sub-pixel block in the first block group are located in a second virtual line,
   the first color sub-pixel block in the first block group and the first color sub-pixel block in the second block group are located between the first virtual line and the second virtual line, the first protrusion of the first color sub-pixel block in the first block group is protruded toward the second virtual line, the first protrusion of the first color sub-pixel block in the second block group is protruded toward the first virtual line,
   the plurality of block groups comprises a third block group and a fourth block group,
   in each of the plurality of repeating regions, the second base edge of the second color sub-pixel block and the third base edge of the third color sub-pixel block in the third block group are located in the second virtual line, the second base edge of the second color sub-pixel block and the third base edge of the third color sub-pixel block in the fourth block group are located in a third virtual line, the third virtual line is located at a side of the second virtual line away from the first virtual line,
   the first color sub-pixel block in the third block group and the first color sub-pixel block in the fourth block group are located between the second virtual line and the third virtual line, the first protrusion of the first color sub-pixel block in the third block group is protruded toward the second virtual line, the first protrusion of the first color sub-pixel block in the fourth block group is protruded toward the third virtual line,
   within the same one of the plurality of repeating region, the second color sub-pixel block of the first block group and the second color sub-pixel block of the third block group are integrated to form a second unitary sub-pixel block;
   within two adjacent ones of the plurality of repeating regions in a direction perpendicular to the first virtual line, the two adjacent ones of the plurality of repeating regions comprise a first repeating region and a second repeating region sequentially arranged in the direction perpendicular to the first virtual line; and the second color sub-pixel block of the fourth block group of the first repeating region and the second color sub-pixel block of the second block group of the second repeating region are integrated to form a second unitary sub-pixel block,
   within the same one of the plurality of repeating region, the third color sub-pixel block of the first block group and the third color sub-pixel block of the third block group are integrated to form a third unitary sub-pixel block;
   the third color sub-pixel block of the fourth block group of the first repeating region and the third color sub-pixel block of the second block group of the second repeating region are integrated to form a third unitary sub-pixel block,
   the distance between a vertex of the first protrusion of the first color sub-pixel block of the second block group and a vertex of the first protrusion of the first color sub-pixel block of the fourth block group is smaller or equal to a distance between the first virtual line and the second virtual line,
   a distance between a vertex of the first protrusion of the first color sub-pixel block of the second block group and a vertex of the first protrusion of the first color sub-pixel block of the fourth block group is larger than a length of the second unitary sub-pixel block in a direction perpendicular to the first virtual line and a length of the third unitary sub-pixel block in a direction perpendicular to the first virtual line,
   the first color sub-pixel block of the second block group and the first color sub-pixel block of the fourth block group are spaced part from each other, a distance between the first color sub-pixel block of the second block group and the first color sub-pixel block of the fourth block group is smaller than the length of the second unitary sub-pixel block in the direction perpendicular to the first virtual line and the length of the third unitary sub-pixel block in the direction perpendicular to the first virtual line, a distance between a center of the first color sub-pixel block of the second block group and a center of the first color sub-pixel block of the fourth block group is larger than the length of the second unitary sub-pixel block in the direction perpendicular to the first virtual line and the length of the third unitary sub-pixel block in the direction perpendicular to the first virtual line.

2. The array substrate according to claim 1, wherein, the first color sub-pixel block of the second block group is not overlapped with the second virtual line, the first color sub-pixel block of the fourth block group is not overlapped with the second virtual line, the first color sub-pixel block of the second block group and the first color sub-pixel block of the fourth block group are located at two sides of the second virtual line.

3. The array substrate according to claim 1, wherein, a distance between an orthographic projection of the first color sub-pixel block in the first block group on a fourth virtual line perpendicular to the first virtual line and an orthographic projection of the second color sub-pixel in the first block group on the fourth virtual line is smaller than a distance between the first color sub-pixel in the second block group and the first color sub-pixel in the fourth block group.

4. The array substrate according to claim 1, wherein a shortest distance between the first color sub-pixel block of the second block group and the first color sub-pixel block of the fourth block group and a shortest distance between the second color sub-pixel block and the third color sub-pixel block in the second block group are different.

5. The array substrate according to claim 1, the shape of the first color sub-pixel block comprises an oblique edge, being not parallel to the first virtual line or a direction perpendicular to the first virtual line, the shape of the second color sub-pixel block comprises an oblique edge, being not parallel to the first virtual line or a direction perpendicular to the first virtual line, the shape of the third color sub-pixel block comprises an oblique edge, being not parallel to the first virtual line or a direction perpendicular to the first virtual line, the oblique edge of a first one of the first color sub-pixel block, the second color sub-pixel block, and the third color sub-pixel block is substantially parallel to the oblique edge of a second one of the first color sub-pixel block, the second color sub-pixel block, and the third color sub-pixel block, which is adjacent to the first one of the first color sub-pixel block, the second color sub-pixel block, and the third color sub-pixel block.

6. The array substrate according to claim 1, wherein, a shape of at least one of the second unitary sub-pixel block and the third unitary sub-pixel block comprises a parallel edge group, the parallel edge group comprises two parallel edges, which are both approximately parallel to a direction perpendicular to the first virtual line, and the two parallel edges have different lengths.

7. The array substrate according to claim 1, wherein a shape of at least one of the second unitary sub-pixel block and the third unitary sub-pixel block comprises a hexagon, the hexagon comprises a parallel edge group comprising two parallel edges, a first opposite edge group comprising two opposite edges, and a second opposite edge group comprising two opposite edges, the two opposite edges in the first opposite edge group are disposed opposite to each other, the two opposite edges in the second opposite edge group are disposed opposite to each other, and the two parallel edges in the parallel edge group have different lengths.

8. The array substrate according to claim 7, wherein, the two parallel edges in the parallel edge group of at least one of the second unitary sub-pixel block and the third unitary sub-pixel block in the first block group and the third block group are approximately parallel to a direction perpendicular to the first virtual line, one of the two parallel edges in the parallel edge group which is close to a center line, passing through a center of the first color sub-pixel block in the first block group and extending along the direction perpendicular to the first virtual line, is a first parallel edge, and one of the two parallel edges in the parallel edge group which is away from the center line, passing through a center of the first color sub-pixel block in the first block group and extending along the direction perpendicular to the first virtual line, is a second parallel edge, a length of the first parallel edge is smaller than or equal to a length of the second parallel edge.

9. The array substrate according to claim 7, wherein, a shape of the second unitary sub-pixel block and a shape of the third unitary sub-pixel block both comprise the hexagon, a distance between the first parallel edge of the hexagon of the second unitary sub-pixel block in the first block group and the third block group and the center line of the first color sub-pixel block in the first block group is smaller than a distance between the first parallel edge of the hexagon of the third unitary sub-pixel block in the first block group and the third block group and the center line of the first color sub-pixel block in the first block group, and a length of the first parallel edge of the hexagon of the second unitary sub-pixel block in the first block group and the third block group is smaller than a length of the first parallel edge of the hexagon of the third unitary sub-pixel block in the first block group and the second block group, or, a distance between the first parallel edge of the hexagon of the second unitary sub-pixel block in the first block group and the third block group and the center line of the first color sub-pixel block in the first block group is larger than a distance between the first parallel edge of the hexagon of the third unitary sub-pixel block in the first block group and the third block group and the center line of the first color sub-pixel block in the first block group, and a length of the first parallel edge of the hexagon of the second unitary sub-pixel block in the first block group and the third block group is larger than a length of the first parallel edge of the hexagon of the third unitary sub-pixel block in the first block group and the second block group.

10. The array substrate according to claim 1, wherein a center line of the first sub-pixel block in the first block group extending in a direction perpendicular to the first virtual line passes through at least one of the second unitary sub-pixel block and the third unitary sub-pixel block.

11. The array substrate according to claim 1, wherein, two adjacent ones of the plurality of second color sub-pixel blocks are integrated into a second unitary sub-pixel block, and two adjacent ones of the plurality of third color sub-pixel blocks are integrated into a third unitary sub-pixel block, the shape of at least one of the second unitary sub-pixel block and the third unitary sub-pixel block comprises a polygon, the polygon comprises two vertexes which have the largest distance in the second direction, and a line connecting the two vertexes is approximately parallel to a direction perpendicular to the first virtual line, in the polygon of at least one of the second unitary sub-pixel block and the third unitary sub-pixel block, an area of a first portion located at a first side of the line connecting the two vertexes is different from an area of a second portion located at a second side of the line connection the two vertexes.

12. The array substrate according to claim 11, wherein, a width of the first portion in a direction perpendicular to the first virtual line is different from a width of the second portion in the direction perpendicular to the first virtual line.

13. The array substrate according to claim 1, further comprising:
  a first color pixel electrode,
  a first pixel defining layer, provided on the first color pixel electrode and comprising a first opening exposing a portion of the first color pixel electrode,
  a first color light-emitting layer, provided on the first pixel defining layer and contacting the portion of the first color pixel electrode as exposed by the first opening;
  a second color pixel electrode,
  a second pixel defining layer, provided on the second color pixel electrode and comprising a second opening exposing a portion of the second color pixel electrode,
  a second color light-emitting layer, provided on the second pixel defining layer and contacting the portion of the second color pixel electrode as exposed by the second opening;
  a third color pixel electrode,
  a third pixel defining layer, provided on the third color pixel electrode and comprising a third opening exposing a portion of the third color pixel electrode,
  a third color light-emitting layer, provided on the third pixel defining layer and contacting the portion of the third color pixel electrode as exposed by the third opening,
  wherein, two adjacent ones of the plurality of second color sub-pixel blocks are integrated into a second unitary sub-pixel block, and two adjacent ones of the plurality of third color sub-pixel blocks are integrated into a third unitary sub-pixel block, a shape and a size of the second unitary sub-pixel block is defined by the second opening, and a shape and a size of the third unitary sub-pixel block is defined by the third opening;
  two second color pixel electrodes of the two adjacent ones of the plurality of second color sub-pixel blocks integrated into the second unitary sub-pixel block are integrated as one second unitary pixel electrode, two third color pixel electrodes of the two adjacent ones of the plurality of third color sub-pixel blocks integrated into the third unitary sub-pixel block are as one third unitary pixel electrode.

14. The array substrate according to claim 13, wherein, the plurality of block groups comprises a third block group and a fourth block group,
  in each of the plurality of repeating regions, the second base edge of the second color sub-pixel block and the third base edge of the third color sub-pixel block in the third block group are located in the second virtual line, the second base edge of the second color sub-pixel block and the third base edge of the third color sub-pixel block in the fourth block group are located in a third virtual line, the third virtual line is located at a side of the second virtual line away from the first virtual line,
  the first color sub-pixel block in the third block group and the first color sub-pixel block in the fourth block group are located between the second virtual line and the third virtual line, the first protrusion of the first color sub-pixel block in the third block group is protruded toward the second virtual line, the first protrusion of the first color sub-pixel block in the fourth block group is protruded toward the third virtual line,
  the first color light-emitting layer in the second block group and the first color light-emitting layer in the fourth block group are integrated as one first color light-emitting layer, and the first color pixel electrode of the first color sub-pixel block in the third block group and the first color pixel electrode of the first color-pixel block in the fourth block group are two independent first color pixel electrodes.

15. An electronic device, comprising the array substrate according to claim 1.

16. The array substrate according to claim 1, wherein, a distance between the first base edge of the first color sub-pixel block of the second block group and the first base edge of the first color sub-pixel block of the fourth block group is larger than a length of the second color sub-pixel block in the second direction and a length of the third color sub-pixel block in the second direction.

* * * * *